(12) United States Patent
Mallela et al.

(10) Patent No.: US 11,056,391 B2
(45) Date of Patent: Jul. 6, 2021

(54) SUBTRACTIVE VFET PROCESS FLOW WITH REPLACEMENT METAL GATE AND METALLIC SOURCE/DRAIN

(71) Applicant: International Business Machines Corporation, Armonk, NY (US)

(72) Inventors: Hari V. Mallela, Poughquag, NY (US); Robert Russell Robison, Colchester, VT (US); Reinaldo Ariel Vega, Mahopac, NY (US); Rajasekhar Venigalla, Hopewell Junction, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 15/199,550

(22) Filed: Jun. 30, 2016

(65) Prior Publication Data

US 2018/0006118 A1  Jan. 4, 2018

(51) Int. Cl.
| | |
|---|---|
| *H01L 29/10* | (2006.01) |
| *H01L 21/8234* | (2006.01) |
| *H01L 27/088* | (2006.01) |
| *H01L 29/78* | (2006.01) |
| *H01L 29/66* | (2006.01) |
| *H01L 29/417* | (2006.01) |
| *H01L 29/08* | (2006.01) |
| *H01L 29/786* | (2006.01) |

(52) U.S. Cl.
CPC ........ *H01L 21/823412* (2013.01); *H01L 21/823487* (2013.01); *H01L 27/088* (2013.01); *H01L 29/0847* (2013.01); *H01L 29/41741* (2013.01); *H01L 29/665* (2013.01); *H01L 29/66545* (2013.01); *H01L 29/66666* (2013.01); *H01L 29/7827* (2013.01); *H01L 29/78642* (2013.01)

(58) Field of Classification Search
None
See application file for complete search history.

(56) References Cited

U.S. PATENT DOCUMENTS

| | | | |
|---|---|---|---|
| 6,518,622 B1 | 2/2003 | Chew et al. |
| 6,664,143 B2 | 12/2003 | Zhang |
| 6,773,994 B2 | 8/2004 | Chittipeddi et al. |
| 7,033,877 B2 | 4/2006 | Chaudhry et al. |
| 7,446,025 B2 | 11/2008 | Cohen et al. |

(Continued)

OTHER PUBLICATIONS

B. A. Anderson et al., "Vertical Transistor Fabrication and Devices," U.S. Appl. No. 14/975,168, filed Dec. 18, 2015.

(Continued)

*Primary Examiner* — Daniel Whalen
(74) *Attorney, Agent, or Firm* — Randall Bluestone, Esq.; McGinn I.P. Law Group, PLLC.

(57) ABSTRACT

A method and a semiconductor device includes a substrate, and a first device type formed on the substrate, the first device type including an active channel region including a first fin, the first fin including a first fin width which is narrower than a second fin width above and below the active channel region. A second device type can be formed on the same substrate, the second device type includes a second active channel region including a second fin, the second fin including a first fin width which is the same as the second fin width both above and below the second active channel region.

3 Claims, 25 Drawing Sheets

(56) References Cited

U.S. PATENT DOCUMENTS

| | | | | |
|---|---|---|---|---|
| 9,299,835 B1* | 3/2016 | Anderson | ............ | H01L 29/7827 |
| 2007/0298564 A1* | 12/2007 | Brar | .................... | H01L 27/0629 |
| | | | | 438/212 |
| 2013/0043468 A1* | 2/2013 | Adekore | ............... | H01L 29/267 |
| | | | | 257/43 |
| 2018/0337183 A1* | 11/2018 | Glass | .................... | H01L 29/785 |

OTHER PUBLICATIONS

H. V. Mallela et al., "Vertical Field Effect Transistors With Metallic Source/Drain Regions," U.S. Appl. No. 15/140,763, filed Apr. 28, 2016.

K. Cheng et al., "Fabrication of Vertical Field Effect Transistor Structure With Controlled Gate Length," U.S. Appl. No. 15/087,074, filed Mar. 31, 2016.

M. Hergenrother et al., "The vertical replacement-gate (VRG) MOSFET: A 50-nm vertical MOSFET with lithography-independent gate length," International Electron Devices Meeting, 1999, pp. 75-78.

* cited by examiner

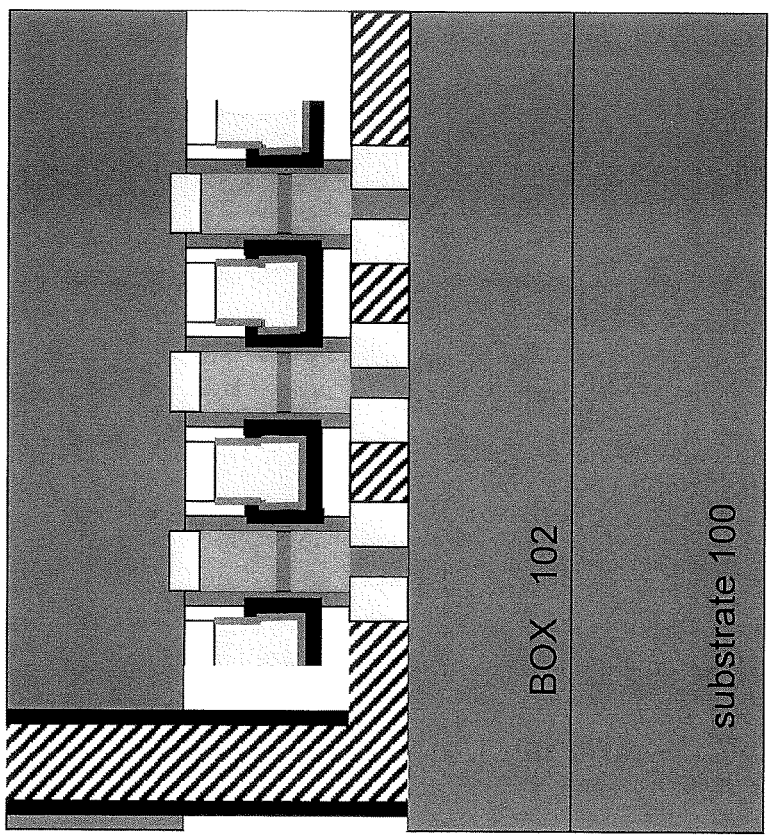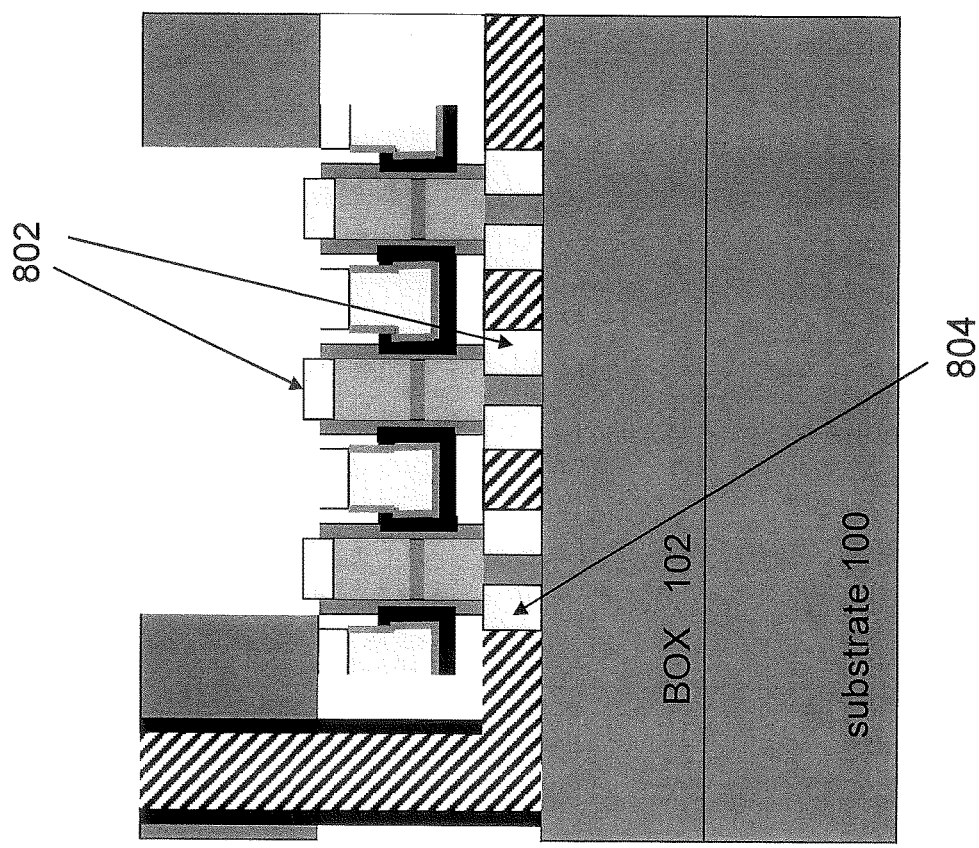
FIG. 8B
FIG. 8A

SUBTRACTIVE VFET PROCESS FLOW WITH REPLACEMENT METAL GATE AND METALLIC SOURCE/DRAIN

BACKGROUND OF THE INVENTION

Field of The Invention

The present invention relates generally to a method and apparatus for Subtractive VFET process flow, and more particularly, but not by way of limitation, relating to a method and apparatus for Subtractive VFET process flow with Replacement Metal Gate and Metallic Source/Drain.

Description of The Related Art

The use of VFETs (Vertical Field-Effect Transistor) has increased over the years, but the manufacture of such devices has made limited improvements. Some integration techniques require the finned channel region to be formed by growth inside a confined cavity. Such VFET integration schemes assume that the fin region is formed inside such a cavity, which is defined/etched through the material that eventually becomes the bottom source/drain spacer. This type of process flow poses a defectivity risk for the finned epitaxy, at the interface between the finned epitaxy region and the bottom source/drain region upon which this epitaxy is grown. The grown fin has such problems and others.

Such techniques also require additional gate etching (which would compromise gate resistance), but this approach poses a risk for defective epitaxial growth for the finned channel regions. Additionally, this type of approach requires added complexity in order to form EG (thick gate dielectric) and SG (thin gate or single gate dielectric) devices. Therefore, there is need for providing long and short channel devices in vertical channel transistor device chips that is easy to manufacture.

There is also a need to provide a more efficient technique of forming an FET including a VFET and other devices that have reduced defects and reduce the complexity of manufacture.

SUMMARY OF INVENTION

In view of the foregoing and other problems, disadvantages, and drawbacks of the aforementioned background art, an exemplary aspect of the present invention provides a system, apparatus, and method of providing a method and apparatus for Subtractive VFET process flow with replacement metal gate and metallic source/drain.

One example aspect of the present invention provides a semiconductor device, including a first device type formed on a substrate, including an active channel including a first fin width, which is narrower than a second fin width above and below the active channel region. The semiconductor device can also include a second device type including a second active channel including a first fin width, which has the same as the second fin width both above and below the active channel region formed on the same substrate.

The first type device further includes a gate region that is merged between adjacent fins, and a bottom source or drain region includes a metallic material. The first active channel under the gate includes a fin with a width that is smaller than that of the fins under both a top and bottom sidewall spacers. The fin region under the gate region, a top sidewall spacer, and a bottom sidewall spacer includes a continuous material. The first device type further including a gate dielectric stack covering a surface of the channel, a bottom surface of the top source or drain region, and a top surface of the bottom source or drain region. The gate dielectric stack includes a high-k dielectric and an interlayer dielectric between said high-k dielectric and the channel surface.

The semiconductor device further includes a top and bottom sidewall spacers include a first dielectric directly covering the top and bottom source or drain surfaces and a second dielectric directly covering the first dielectric. The first dielectric is thicker than said interlayer dielectric. The thinner portion of the fin is self-aligned to the gate. The fin under the top sidewall spacer has a width that is different than the width of the tin under the bottom sidewall spacer.

In another example aspect of present invention, there is described a method of forming a semiconductor device, including forming a first device type including an active channel including a first fin width which is narrower than a second fin width above and below the active channel region, and forming a second device type including an second active channel including a first fin width which has the same as the second fin width both above and below the active channel region In yet another example aspect of present invention, there is described a method of forming a vertical FET (Field Effect Transistor) structure, including forming a fin, depositing a first dielectric around said fin, forming a first encapsulating region along a top portion of said fin, removing said first dielectric from the un-encapsulated portion of said fin, forming a bottom source or drain region along a bottom portion of said fin, removing said first encapsulating region, forming a bottom sidewall spacer region above the bottom source/drain region, forming a dummy gate region above the bottom sidewall spacer region, forming a second encapsulating region around the remaining top portion of the fin above the dummy gate region, removing said dummy gate region to form a replacement gate cavity, removing said first dielectric in the replacement gate cavity, etching a portion of the fin region exposed by the removal of said first dielectric in said replacement gate cavity, filling the replacement gate cavity with a replacement gate stack, recessing the replacement gate stack to a height below the top surface of said fin; and forming a top sidewall spacer region, forming a top source or drain region.

There has thus been outlined, rather broadly, certain embodiments of the invention in order that the detailed description thereof herein may be better understood, and in order that the present contribution to the art may be better appreciated. There are, of course, additional embodiments of the invention that will be described below and which will form the subject matter f the claims appended hereto.

It is to be understood that the invention is not limited in its application to the details of construction and to the arrangements of the components set forth in the following description or illustrated in the drawings. The invention is capable of embodiments in addition to those described and of being practiced and carried out in various ways. Also, it is to be understood that the phraseology and terminology employed herein, as well as the abstract, are for the purpose of description and should not be regarded as limiting, As such, those skilled in the art will appreciate that the conception upon which this disclosure is based may readily be utilized as a basis for the designing of other structures, methods and systems for carrying out the several purposes of the present invention. It is important, therefore, that the claims be regarded as including such equivalent constructions insofar as they do not depart from the spirit and scope of the present invention.

BRIEF DESCRIPTION OF DRAWINGS

The exemplary aspects of the invention will be better understood from the following detailed description of the exemplary embodiments of the invention with reference to the drawings.

FIG. 8A provides a further illustration of method of forming the VFET structure in an example embodiment.

FIG. 8B shows the ILD (interlayer dielectric) refill and CMP (chemical mechanical polishing) of structure shown FIG. 8A.

DETAILED DESCRIPTION OF A PREFERRED EMBODIMENTS

Figure 1B:
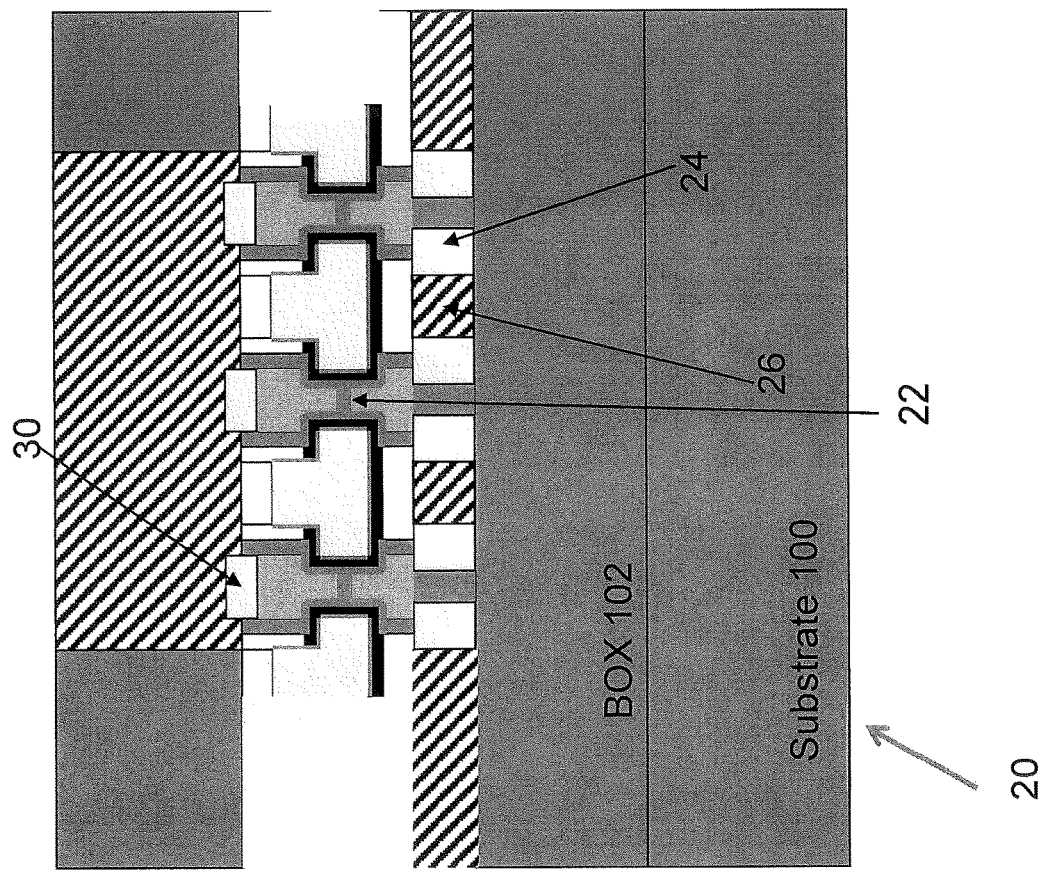
FIG. 1B illustrates a VFET structure with a dumbbell fin.

The invention will now be described with reference to the drawing figures, in which like reference numerals refer to like parts throughout. It is emphasized that, according to common practice, the various features of the drawing are not necessary to scale. On the contrary, the dimensions of the various features can be arbitrarily expanded or reduced for clarity. Exemplary embodiments are provided below for illustration purposes and do not limit the claims.

One of the problems solved by present invention is forming a VFET structure without requiring the finned channel region to be formed by growth inside a confined cavity. The present invention teaches a "subtractive" process flow, to form a VFET structure, wherein the bottom source/drain, gate, and top source/drain are all formed around an etched fin as opposed to a grown fin. The present invention furthermore teaches the formation of top and bottom metallic source/drain regions in this subtractive low context, without requiring additional gate etching (which would compromise gate resistance) in order to access the bottom source/drain region.

The present invention describes a subtractive process flow to achieve a VFET structure, wherein the bottom source/drain, top source/drain, and gate are all formed around a pre-defined fin. The present invention furthermore teaches a method of modulating the fin width post-fin patterning.

Certain value and unexpected results were noted. Dumbbell fin shape enabled in VFET devices can be used. Fins are narrow under the gate for good short channel effects, Fins are fatter under the spacers for good external resistance. Such a configuration enabled by RMG (replacement metal gate) process flow. This furthermore enables vertical PC expansion modulation/optimization for RC (resistance-capacitance) delay.

Metallic top and bottom source/drain regions co-integrated with merged gate structure. This provides low gate and source/drain resistance.

By contrast to related art, this invention teaches a replacement metal gate process applicable to VFETs, which enables both EG (thick gate dielectric) and SG (thin gate or single gate dielectric) device fabrication in a manner very similar to prior and present RMG (replacement metal gate) nodes such as 22 nm, 20 nm, 14 nm, and 10 nm.

Therefore, in this invention, the fins are not grown inside of an open cavity. Structure is instead defined around an etched fin. Merged metal gate fill with metallic top and bottom source/drain. Forming metallic bottom source/drain region requires access to the region after the gate region is defined. Gate region formation requires high temperature processing which a metallic source/drain region cannot withstand (most low-resistance metal silicides are not thermally stable).

Figure 1A:
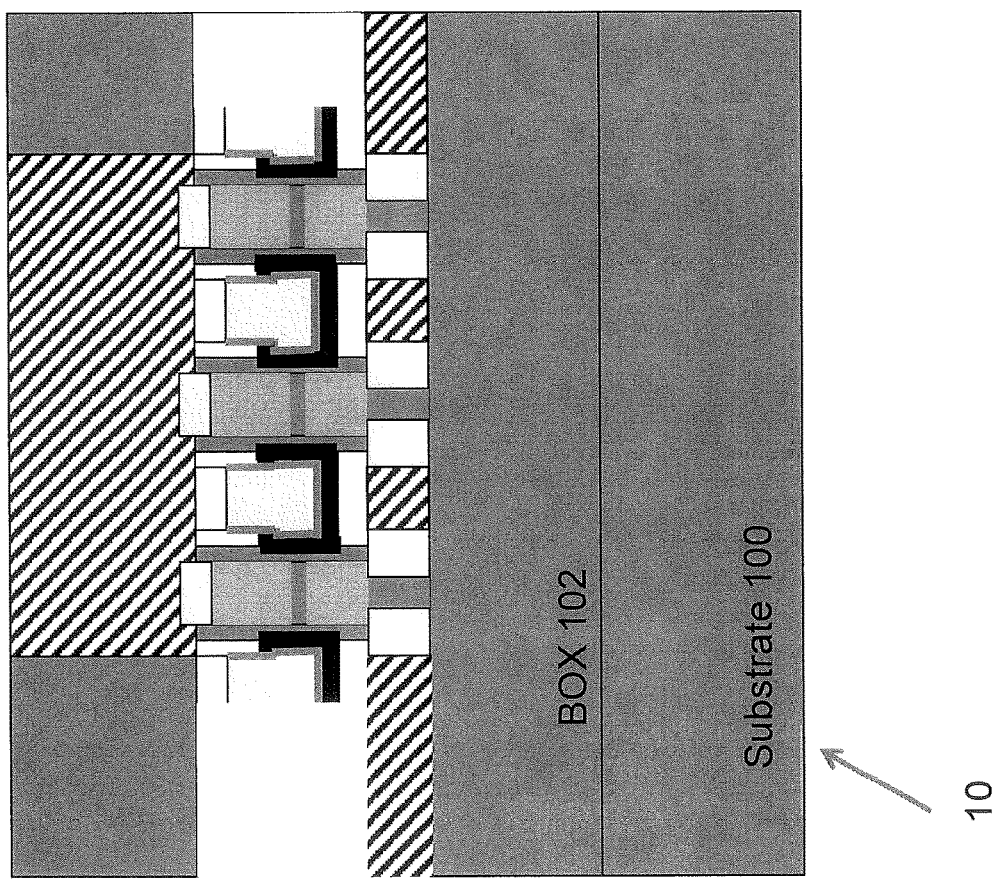
FIG. 1A illustrates a VFET structure without a dumbbell fin.

FIG. 1A illustrates a VFET structure without a dumbbell fin. FIG. 1B illustrates a VFET structure with a dumbbell fin.

Specifically, FIG. 1A shows the final structure of the VFET 10 formed without a dumbbell. FIG. 1B shows the final VFET structure 20 with the dumbbell fin 22 that can be integrated in the same chip as the VFET 10 formed without a dumbbell fin. The VFET device 20 is formed with a buried oxide (BOX) layer 102 on a substrate 100. The VFET device 20 is shown with a top source/drain silicide 30 above the dumbbell shaped fin 22 and a bottom source/drain silicide 24 and bottom source/drain metal fill 26 below the dumbbell shaped fin 22.

The dumbbell fin 22 is formed as a consequence of RMG (replacement metal gate) process as defined in more detail in the following.

Bottom metallic source/drain region 24 and 26 is formed by sacrificial EPI (epitaxial) and downstream subway etch. Top metallic source/drain region 30 formed by contact via RIE (reactive ion etch) plus salicidation.

Figure 2B:
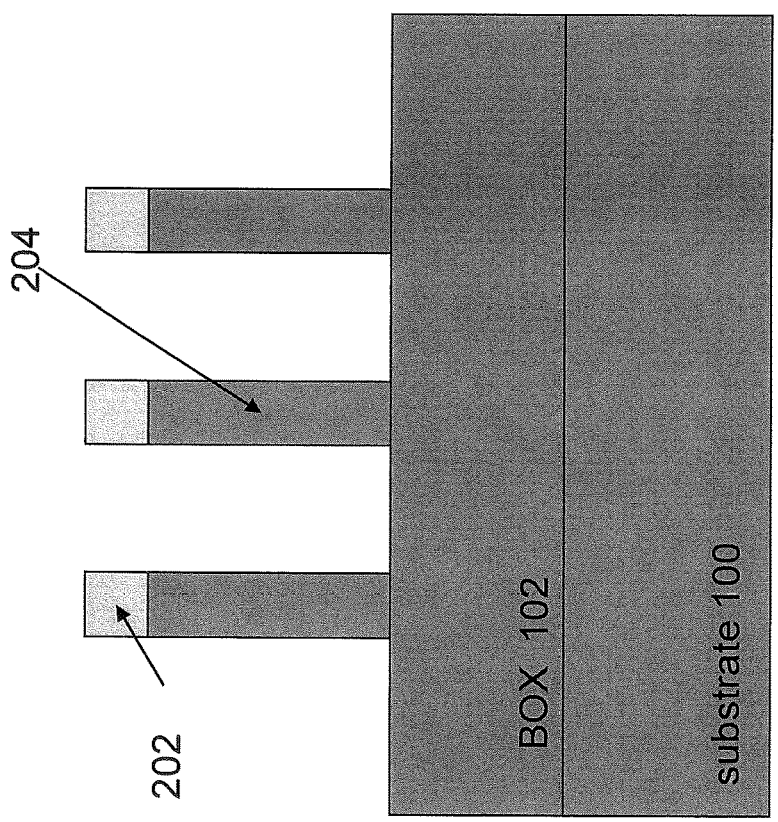
FIGS. 2A through 2U illustrate a method of forming the VFET of FIG. 1B in an example embodiment.
Figure 2A:
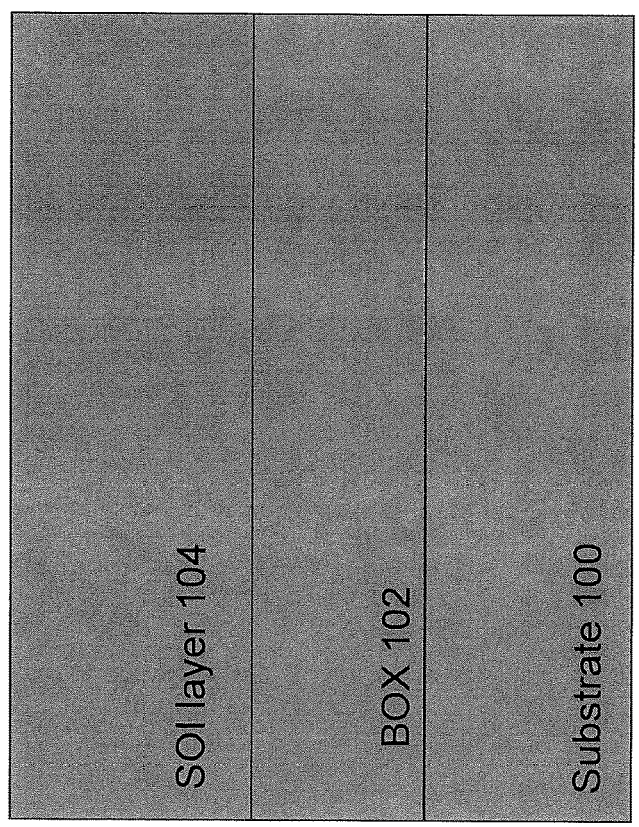
Figure 2D:
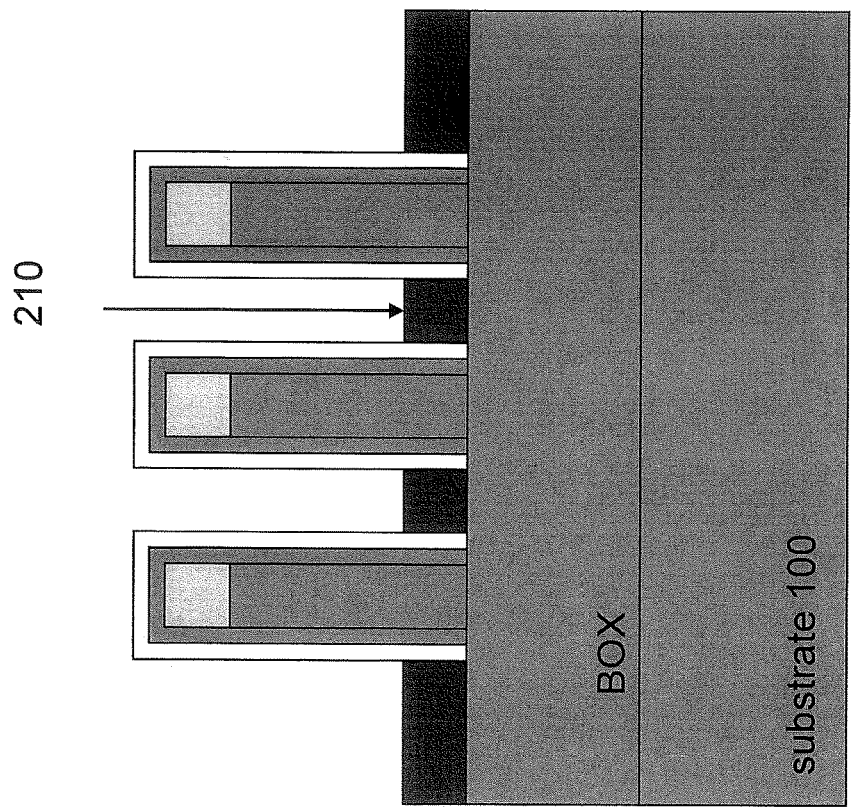
Figure 2C:
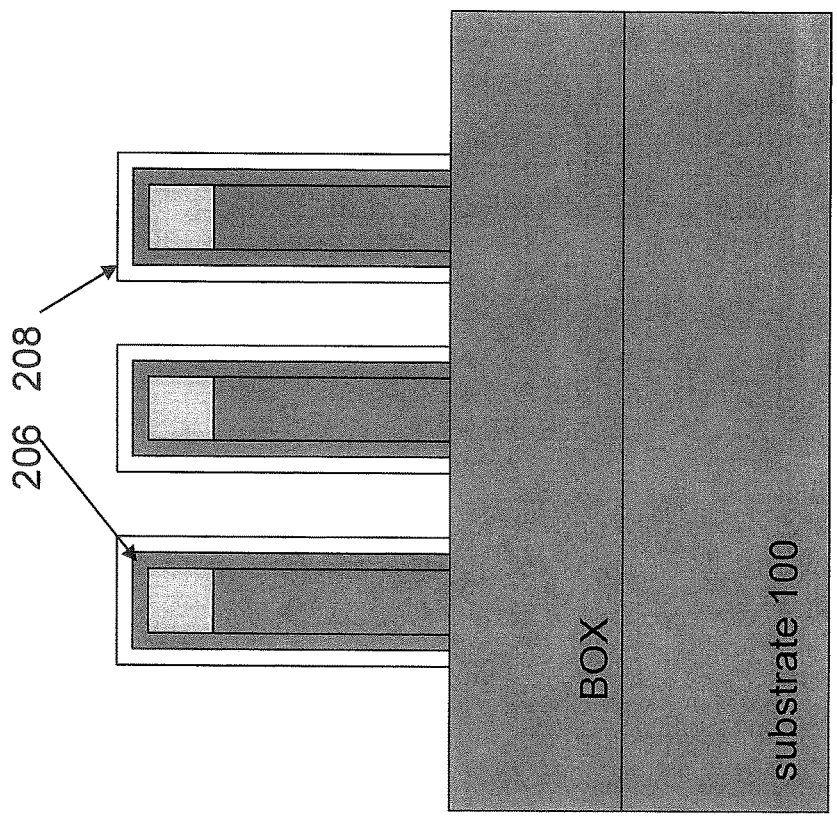
Figure 2F:
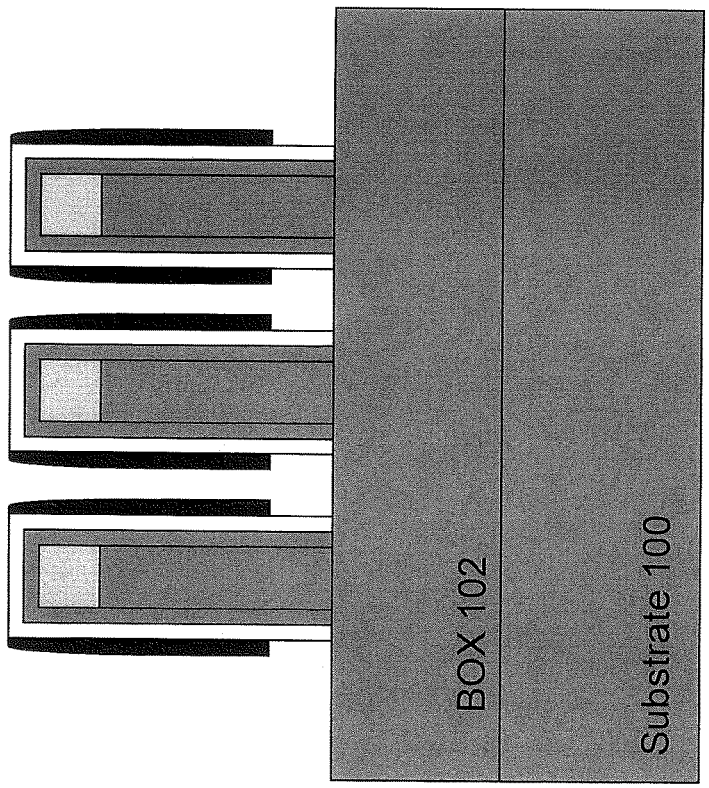
Figure 2E:
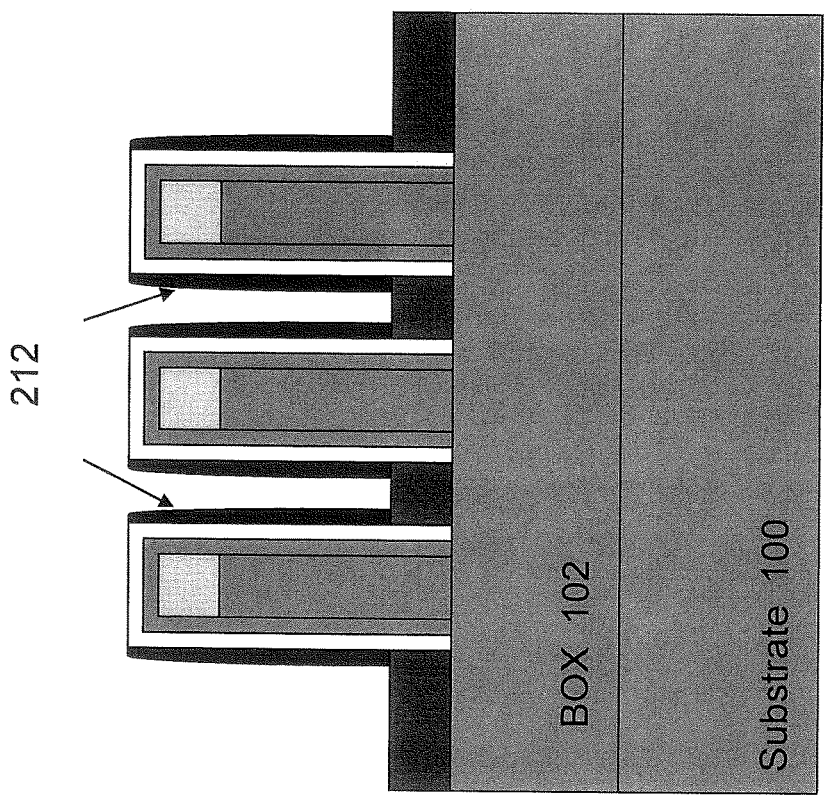
Figure 2H:
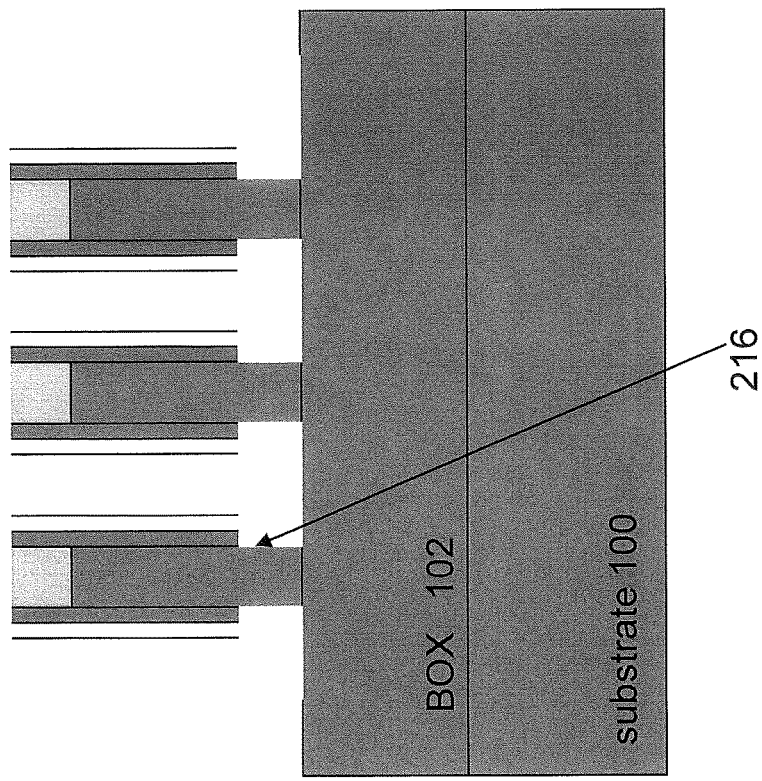
Figure 2G:
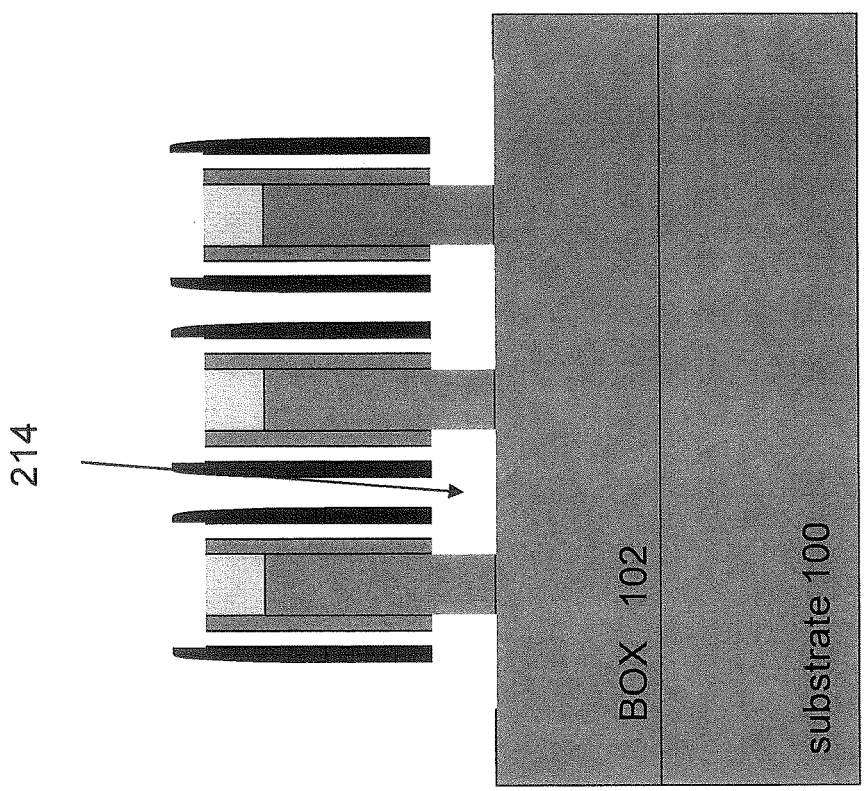
Figure 2J:
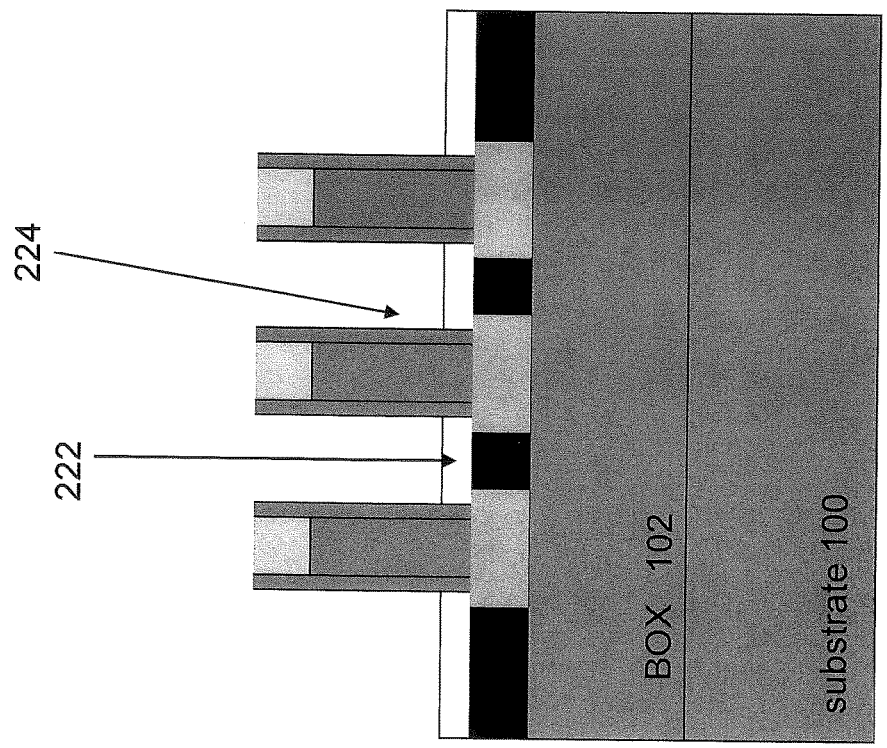
Figure 2I:
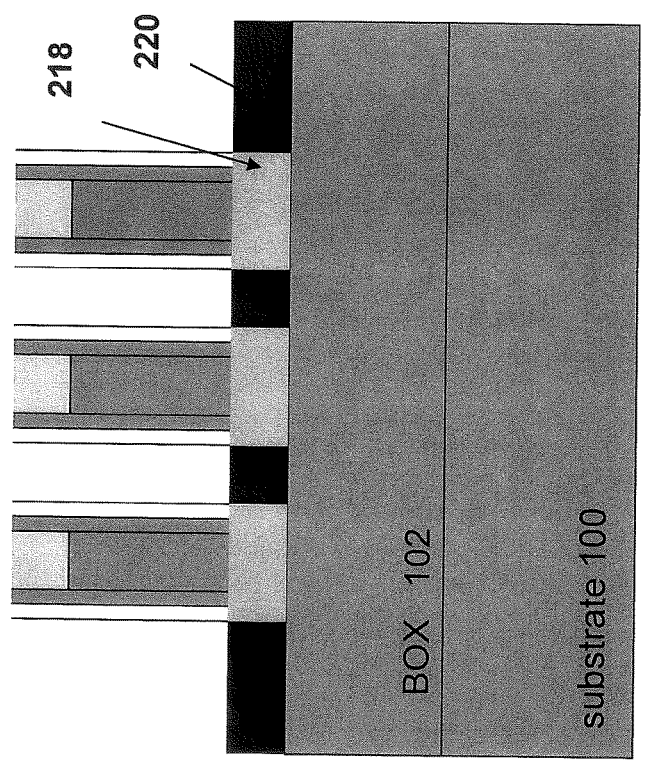
Figure 2L:
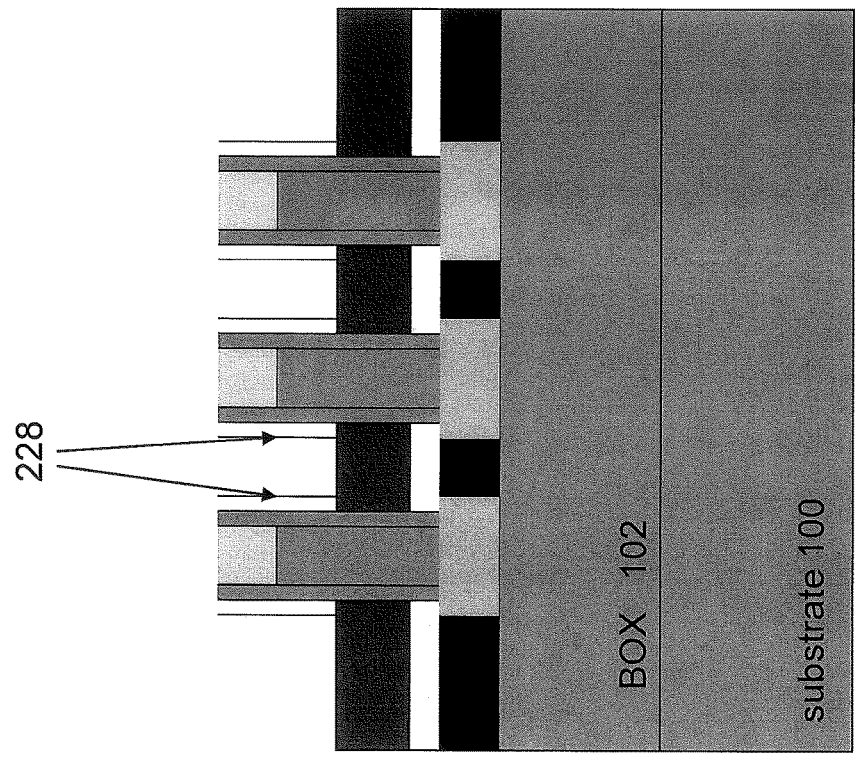
Figure 2K:
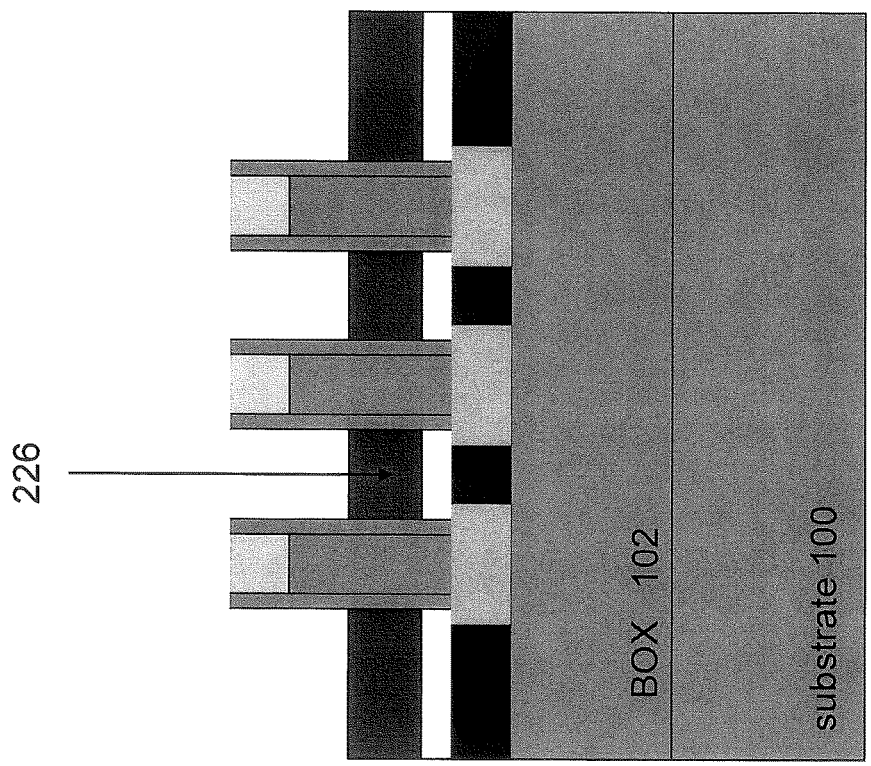
Figure 2N:
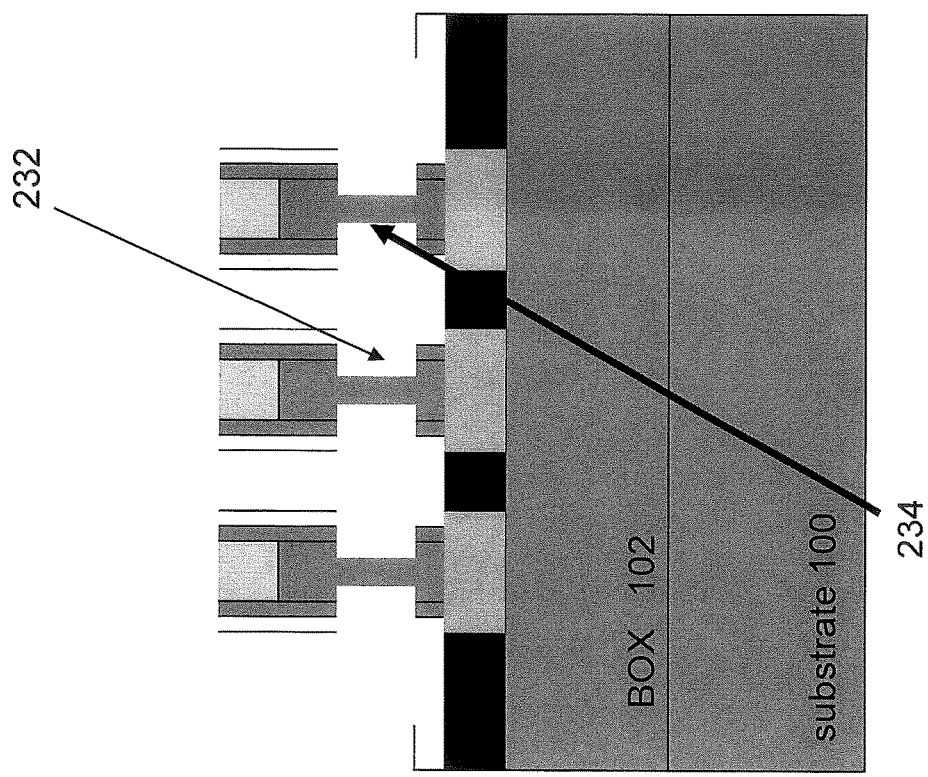
Figure 2M:
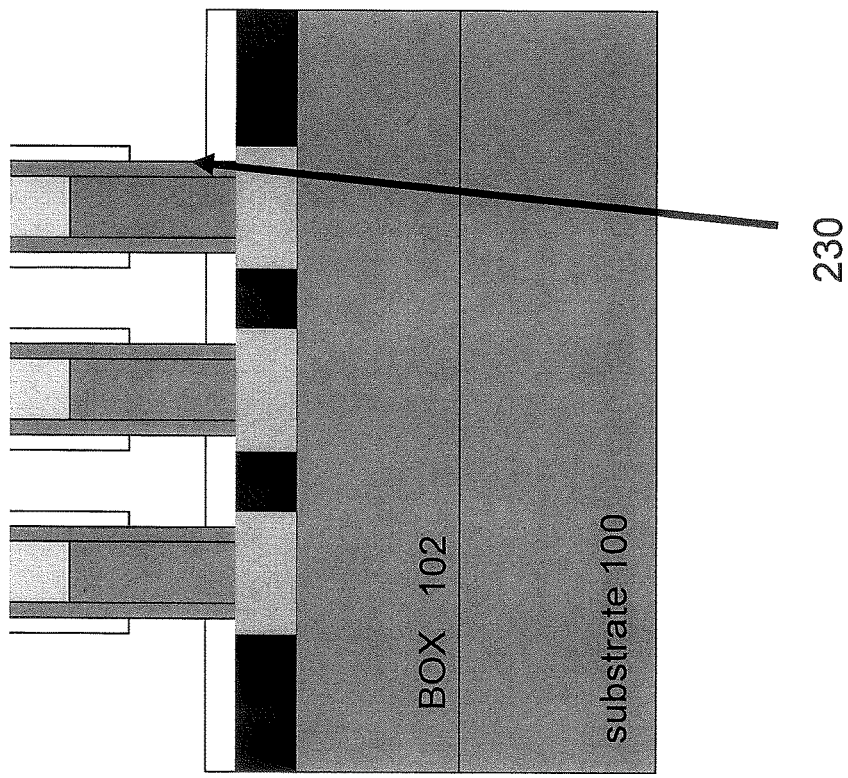
Figure 2P:
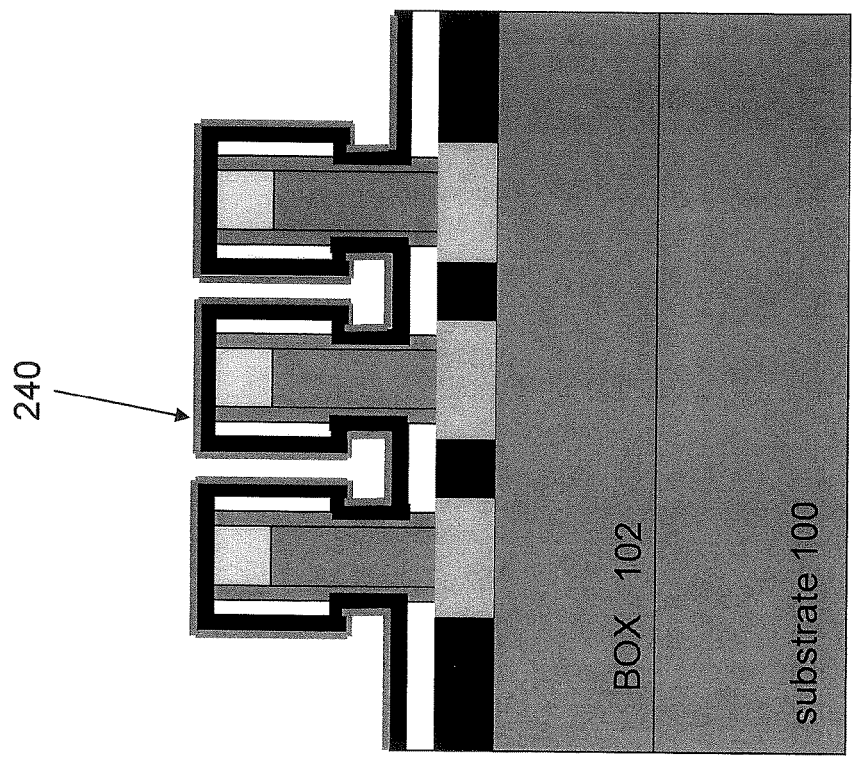
Figure 2O:
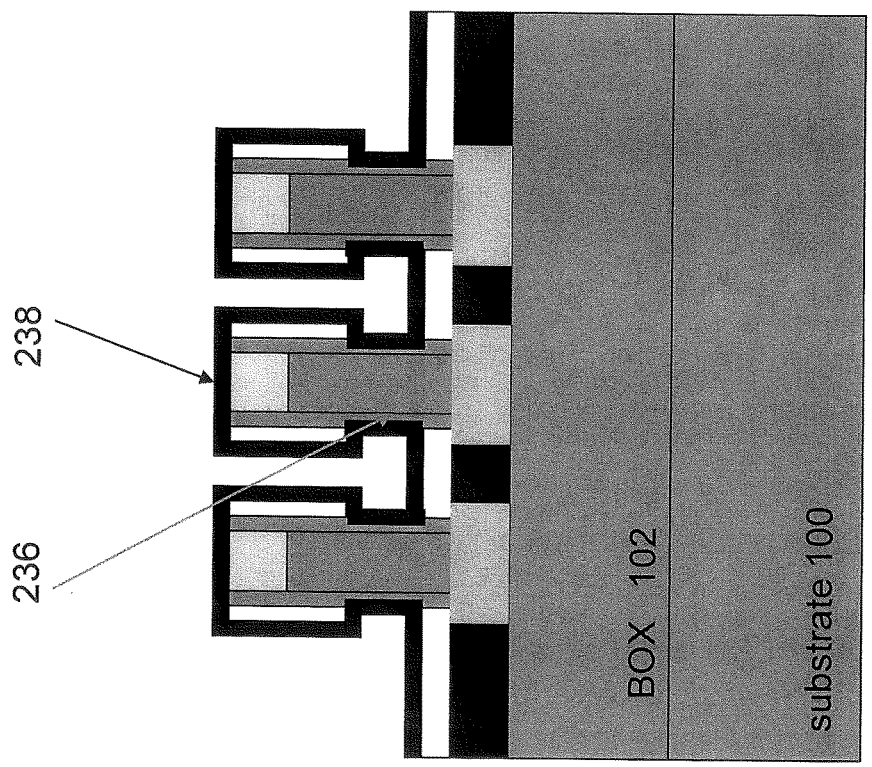
Figure 2R:
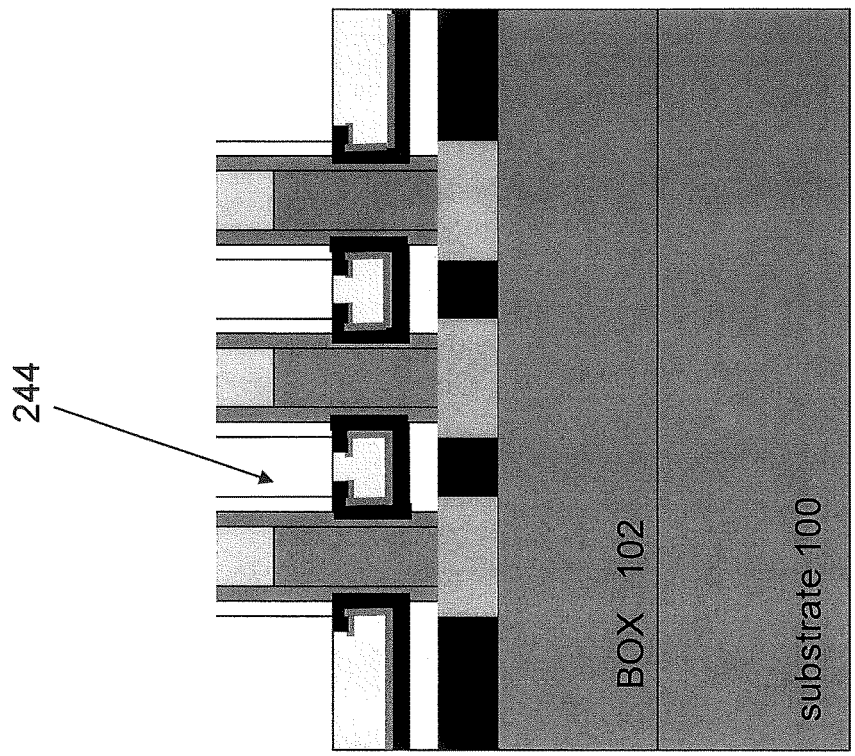
Figure 2Q:
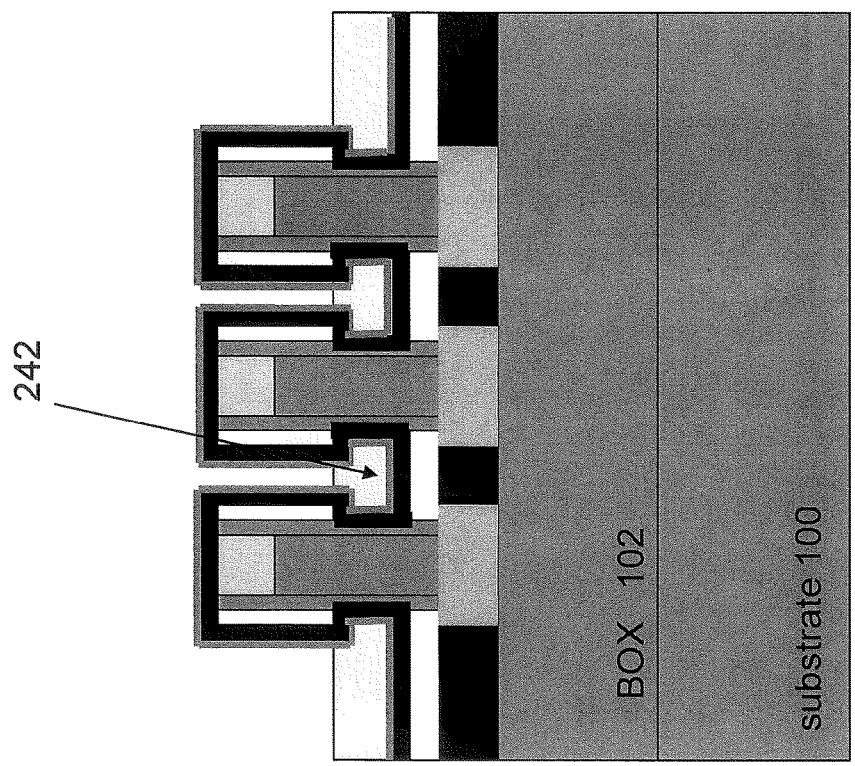
Figure 2T:
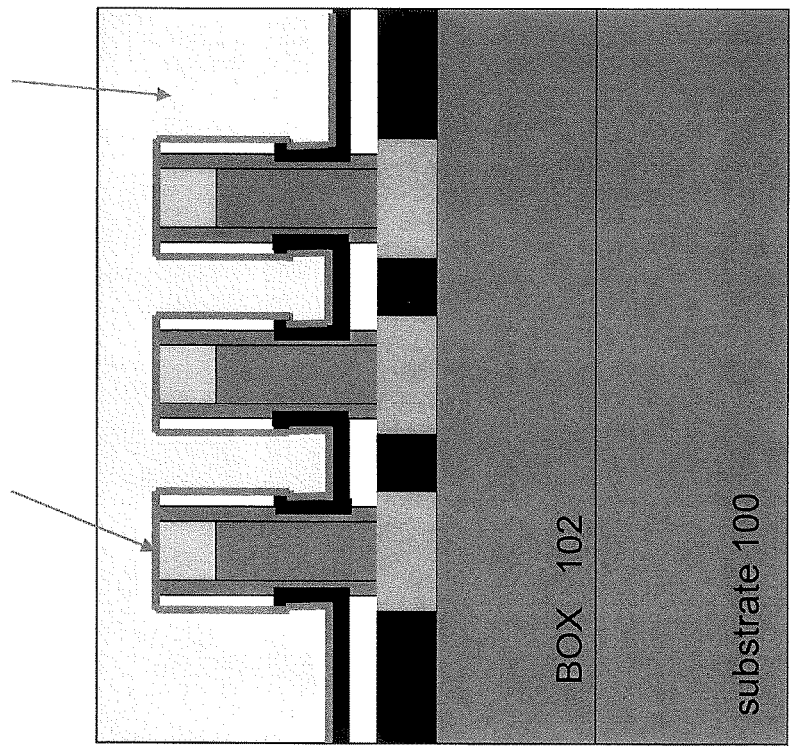
Figure 2S:
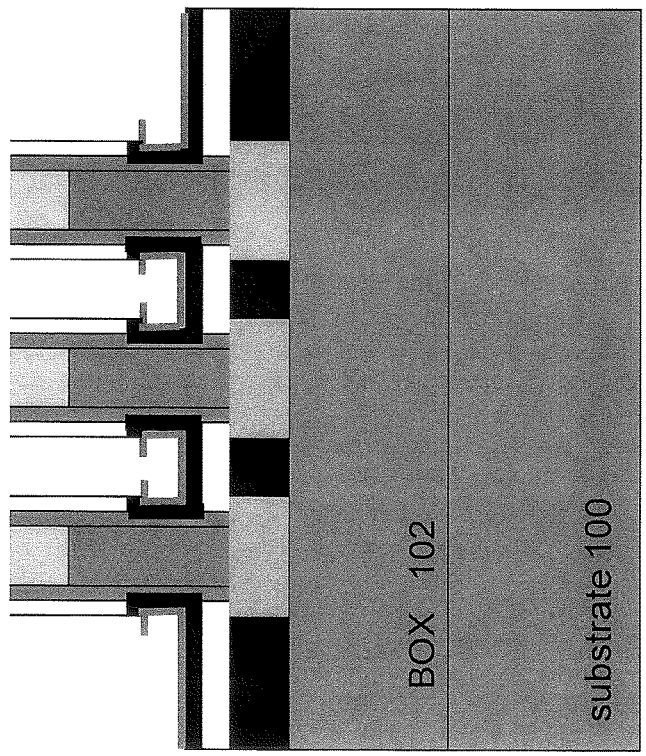
Figure 2U:
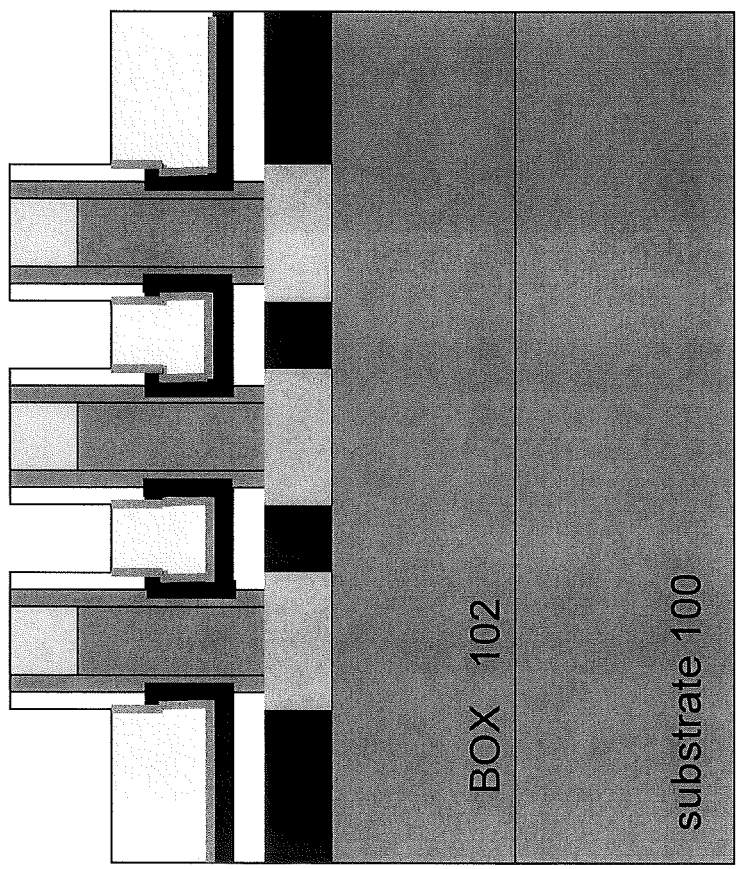

FIGS. 2A through 2U illustrate a method of forming the VFET of FIG. 1B in an example embodiment. Specifically, FIG. 2A illustrates the starting materials for forming the VFET of FIG. 1B in an example embodiment. The starting substrate can include an SOI (silicon on insulator) layer 104, a buried oxide layer 102 formed on a substrate 100. However, the SOI material 104 is merely an example, as other materials such as BULK materials can be used. If bulk material is used, then from starting substrate to fin pattern, one must define global isolation as well as local isolation plus fin reveal etch.

Referring to FIG. 2B, a protective fin cap 202 is provided that may include one or a combination of materials (e.g., oxide buffer layer+nitride main layer). The fins are 204 patterned and etched.

Referring to FIG. 2C, then there is a deposit of oxide 206 and nitride 208 liner.

Referring to FIG. 2D, there is a deposit, planarizing, and etch back of the first sacrificial material 208 of the SOI layer 104. The first sacrificial layer 210 ultimately defines the bottom source/drain region. This could be, for example, amorphous Si or polysilicon.

Referring to FIG. 2E, there is a deposit of protective liner 212 and etch to form a sidewall spacer. The protective liner material can be, for example, $HfO_2$.

Referring to FIG. 2F, one selectively removes first sacrificial material 208. Referring to FIG. 2G, one selectively removes exposed nitride 206 and oxide liner 208 and seen in area 214. Referring to FIG. 2H, exposed fin region may be selectively trimmed (optional) 216. This will affect the extent of silicidation of this region downstream in the process flow. Here, one can assume zero trimming.

Referring to FIG. 2I, there is a bottom in-situ doped source/drain hetero epitaxial growth and drive-in anneal. Depending on how this epitaxial grows after merging, it may be necessary to anisotropically etch the epitaxial material back down to the height defined in this drawing (to prevent the final epitaxial structure from creeping up the fin sidewall).

Referring to FIG. 2I, the epi (epitaxial) layer 218 may be the same material as the fin, and is in-situ doped, while the second epitaxial layer 220 is a different material (and may be undoped), which can be selectively etched relative to the first epitaxial layer. For example the first epitaxial layer 218 can be Si while second epitaxial layer can be SiGe with high Ge content.

Referring to FIG. 2J, the bottom spacer filled 222, CMP (chemical mechanical polishing), and etch back 224 is performed.

Referring to FIG. 2K, there is an amorphous Si fill, CMP, and etchback performed 226. The amorphous Si thickness defines the vertical gate length. Referring to FIG. 2L, there is a nitride deposition and spacer RIE (reactive ion etching) 228 of the structure of FIG. 2K.

Referring to FIG. 2M, there is shown amorphous Si removal 230. Then, as seen in FIG. 2N, there is oxide liner removal over a channel region 232. Fin erosion 234 takes place during dummy oxide removal, to form dumbbell fins. Masked dummy oxide removal would result in devices that where the block level mask exists, providing a structure that essentially looks like the structure shown in FIG. 2M.

Referring to FIG. 2O, there is IL formation 236 and HK (high-κ dielectric) deposition 238. As seen in FIG. 2P, a protective liner is deposited 240. The protective liner 240 may include, for example, TiN, which can be selectively etched over the HK material (e.g., $HfO_2$) later in the process flow. Please note in FIGS. 2O to 2U, for clarity of the drawings for other portions, the dumbbell shape is not drawn, but would be there.

Referring to FIG. 2Q, there is an OPL (organic planarization layer) fill and etchback made 242. The OPL (organic planarization) layer defines the HK recess location. This is done to aid in subsequent gate metal fill deposition.

Referring to FIG. 2R, there is Liner and HK (high-κ dielectric) removal in exposed regions 244. The OPL layer defines the HK recess location. This is done to aid in subsequent gate metal fill deposition.

Referring to FIG. 2S, there is OPL removal and selective HK touch-up etch as shown. HK touch-up etch is optional, but removes any HK "lip" toward the top of the gate which would otherwise make metal gate fill more difficult.

Referring to FIG. 2T, there is the removal of the remaining liner material, and then deposit WFM (work function metal) 216 and low resistance metal fill 248. HK touch-up etch is optional, but it removes any HK "lip" toward the top of the gate which would otherwise make metal gate fill more difficult.

Referring to FIG. 2U, metal CMP is performed, and then metal and WFM recess is made. Metal gate fill (and WFM) must be recessed to some depth beneath the top of the fin.

Figure 3A:
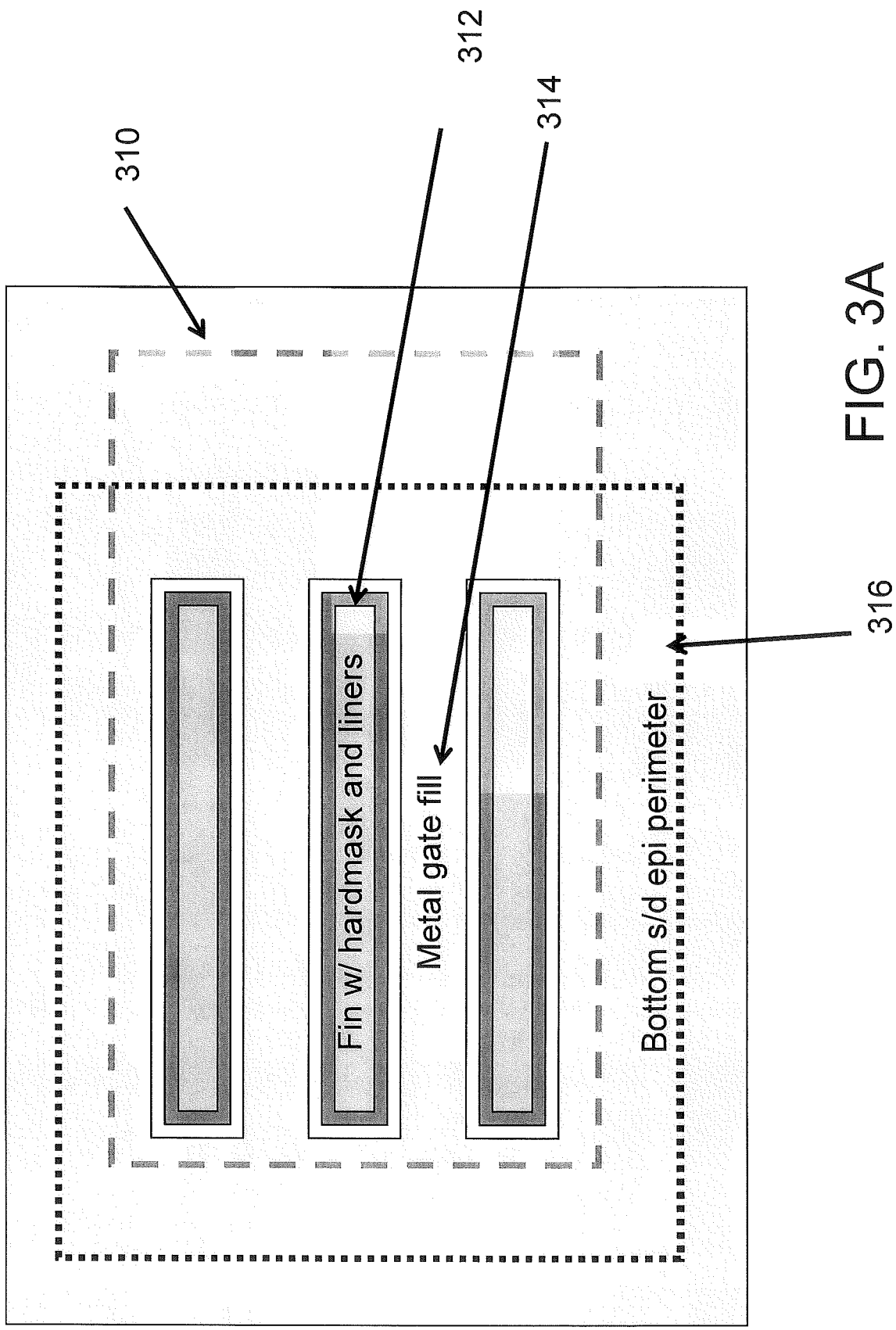
FIG. 3A illustrates a further step in another view of the VFET in an example embodiment.

FIG. 3A illustrates a further step in another view of the VFET in an example embodiment. Then, after gate and WFM recess 310 etch, pattern block mask and remove excess gate material to enable partial exposure of source/drain epi (epitaxial) perimeter (this is needed later for contact formation). The fin with the hard mask and liners are shown in 312 with a metal gate fill 314. Additionally, there is a bottom source/drain epi perimeter 316.

Figure 3B:
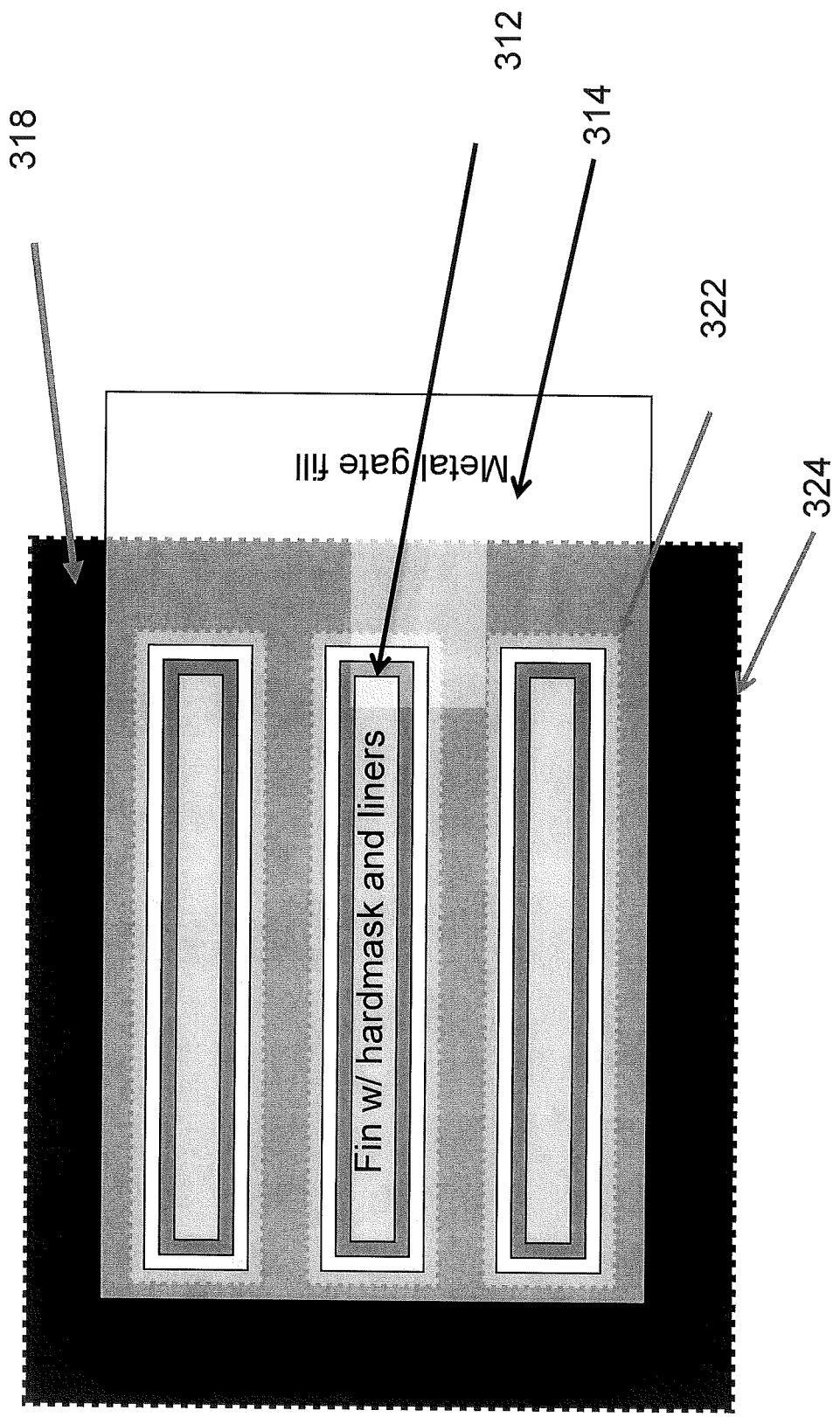
FIG. 3B illustrates a view after a gate removal etch.

FIG. 3B illustrates a view after gate removal etch. Referring to FIG. 3B, the bottom source/drain epi is partially exposed after gate removal etch at 318. The exposed region is primarily the second epi (epi #1) layer. The bottom source/drain epi perimeter defined by second epi (epi #2) layer at 324. The first epi layer is at 322.

Figure 4B:
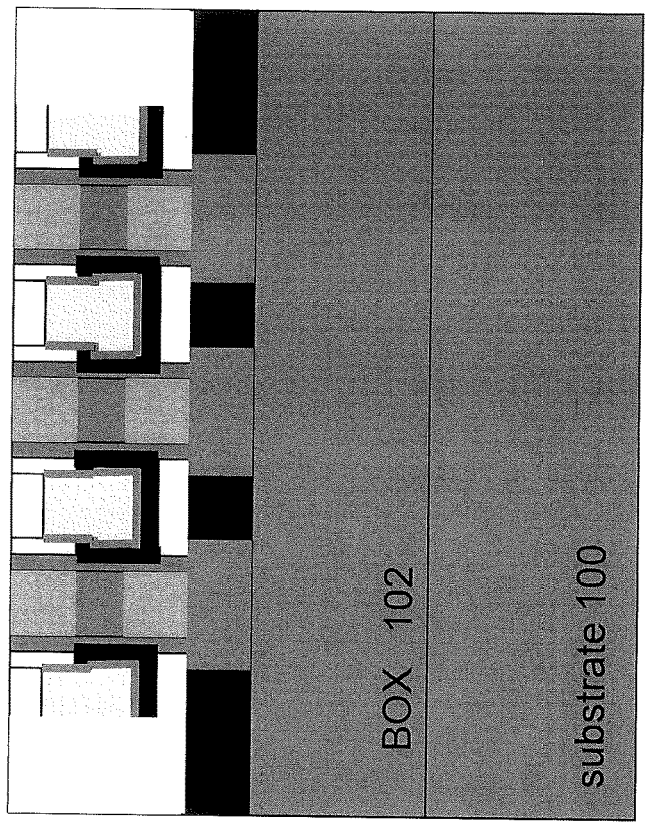
FIG. 4B illustrates the top source/drain implantation of the structure of FIG. 4A.
Figure 4A:
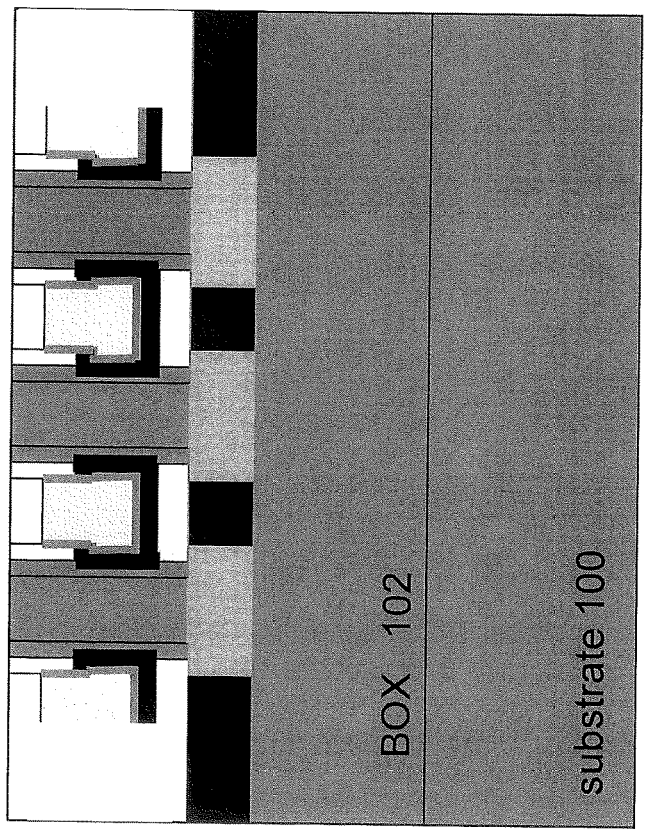
FIG. 4A provides a further illustration of a method of forming the VFET structure in an example embodiment

FIG. 4A provides a further illustration of method of forming the VFET structure in an example embodiment. Then, as seen in FIG. 4A, the next step is to do a top spacer fill and CMP stop on top of the fin. The metal gate fill (and WFM) must be recessed to some depth beneath the top of the fin.

FIG. 4B illustrates the top source/drain implantation. The top source/drain implantation is performed and drive-in anneal (optional) can also be performed. The top fin recess etch may be optionally performed prior to implant. This would adjust the top source/drain proximity to the channel, while also cleaning CMP residuals at the fin top. Subsequently, an optional top source/drain epi may be grown (not shown).

Figure 4D:
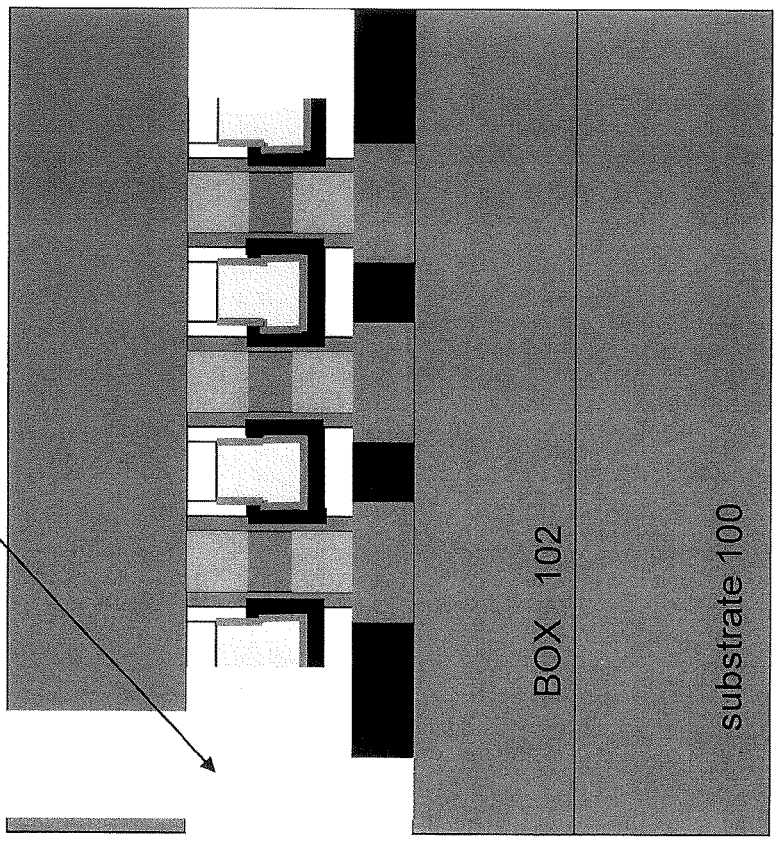
FIG. 4D illustrates the bottom source/drain contact reactive ion etching of the structure of FIG. 4C.
Figure 4C:
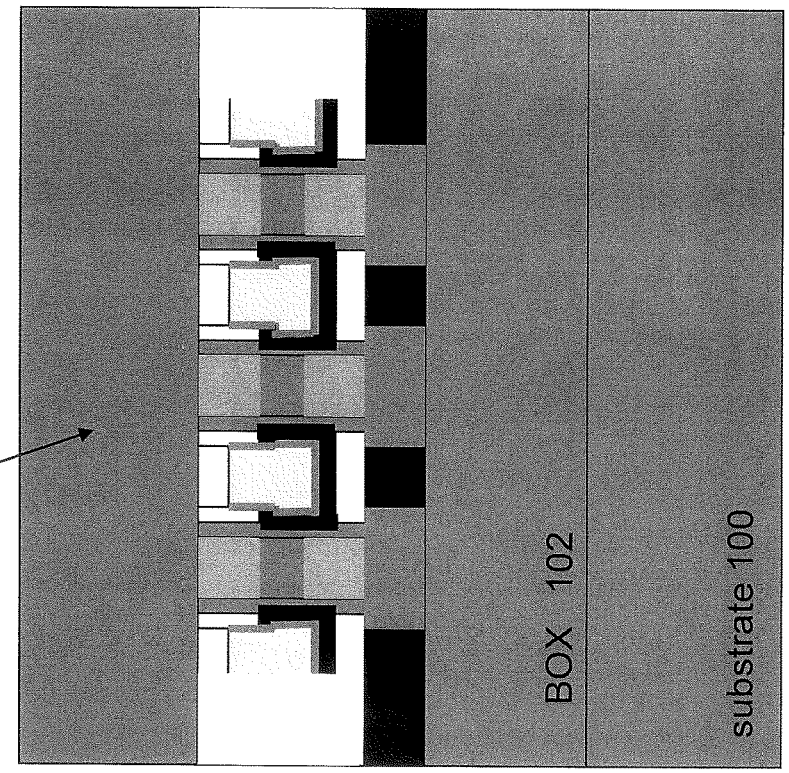
FIG. 4C illustrates the interlayer dielectric deposition of the structure of FIG. 4B.

FIG. 4C illustrates the ILD deposition. The ILD (interlayer dielectric) deposition is performed as shown at point 324. Then in FIG. 4D, the bottom source/drain contact RIE (reactive ion etching) is performed 326. Here, the bottom source/drain contact is shown as parallel to the fins for illustrative simplicity; however, it may also (preferentially) exist perpendicular to the fins, into or out of the page (See FIG. 5A).

Figure 5A:
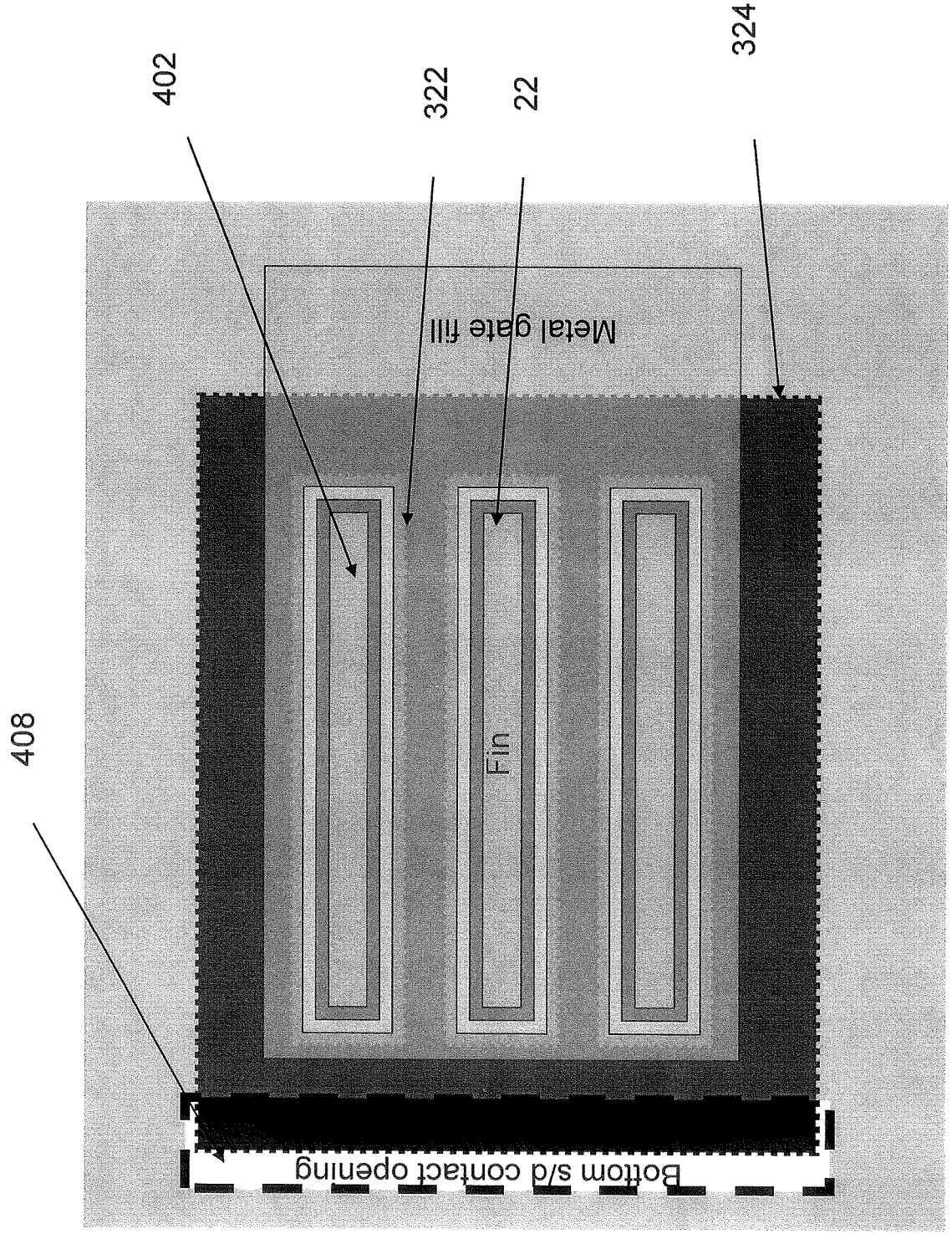
FIG. 5A a further illustration of a method of forming the VFET structure with a different view in an example embodiment.

FIG. 5A provides a further illustration of method of forming the VFET structure with a different view in an example embodiment.

Referring to FIG. 5A, the structure is shown after bottom source/drain contact RIE is performed. The top source/drain epi not shaded in, so underlayers are more easily visible. The top source/drain implanted region 402, bottom source/drain first epi layer perimeter 322, bottom source/drain second epi layer perimeter 324 is provided, the fin 22, and the bottom source/drain contact opening 408 is provided. Only one bottom source/drain contact opening is shown here, but one can have openings defined anywhere around the second epi layer perimeter 406 that does not pass under the metal gate fill region.

Figure 5B:
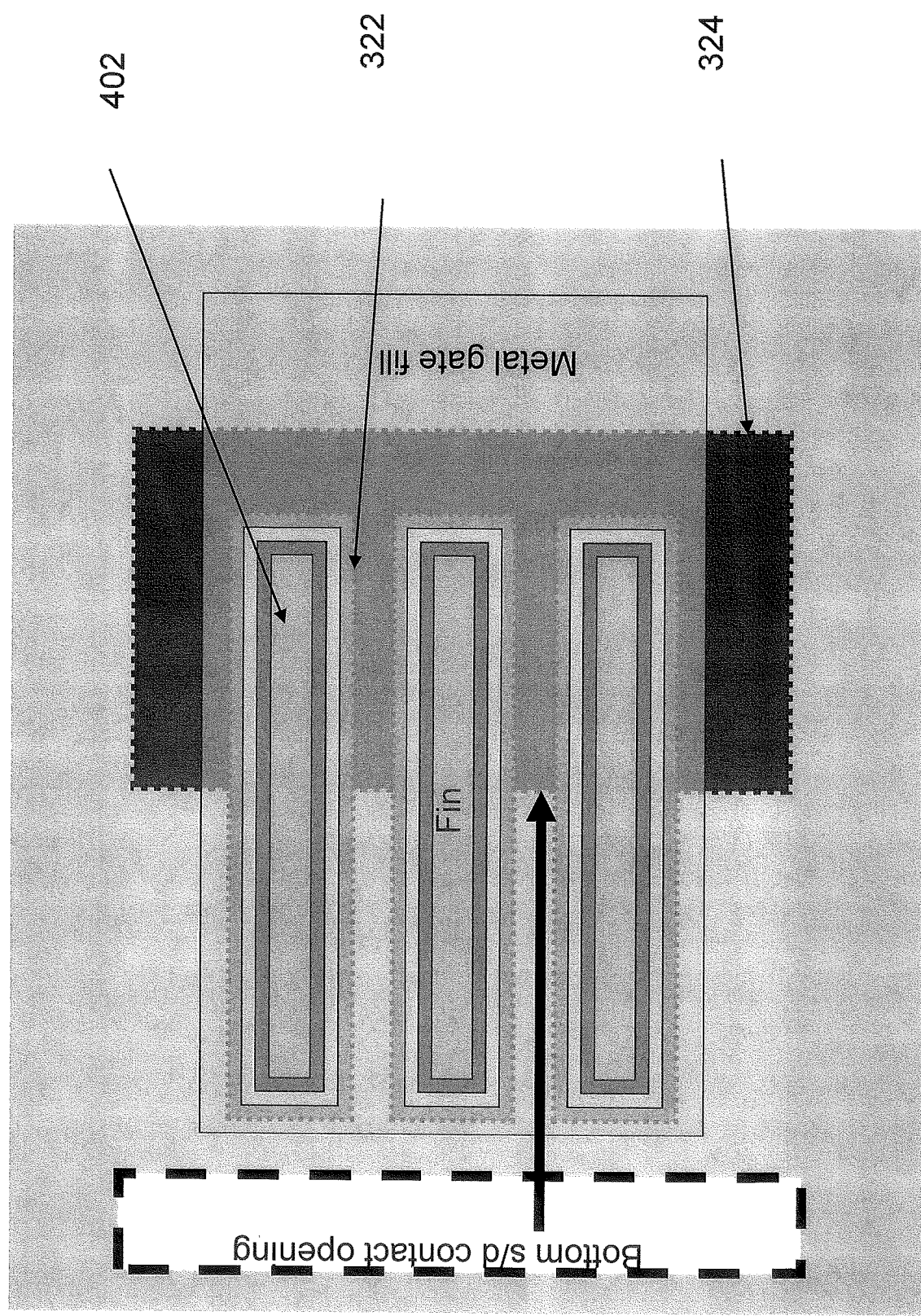
FIG. 5B illustrates an option of selective partial removal of the second epitaxial layer.
Figure 5C:
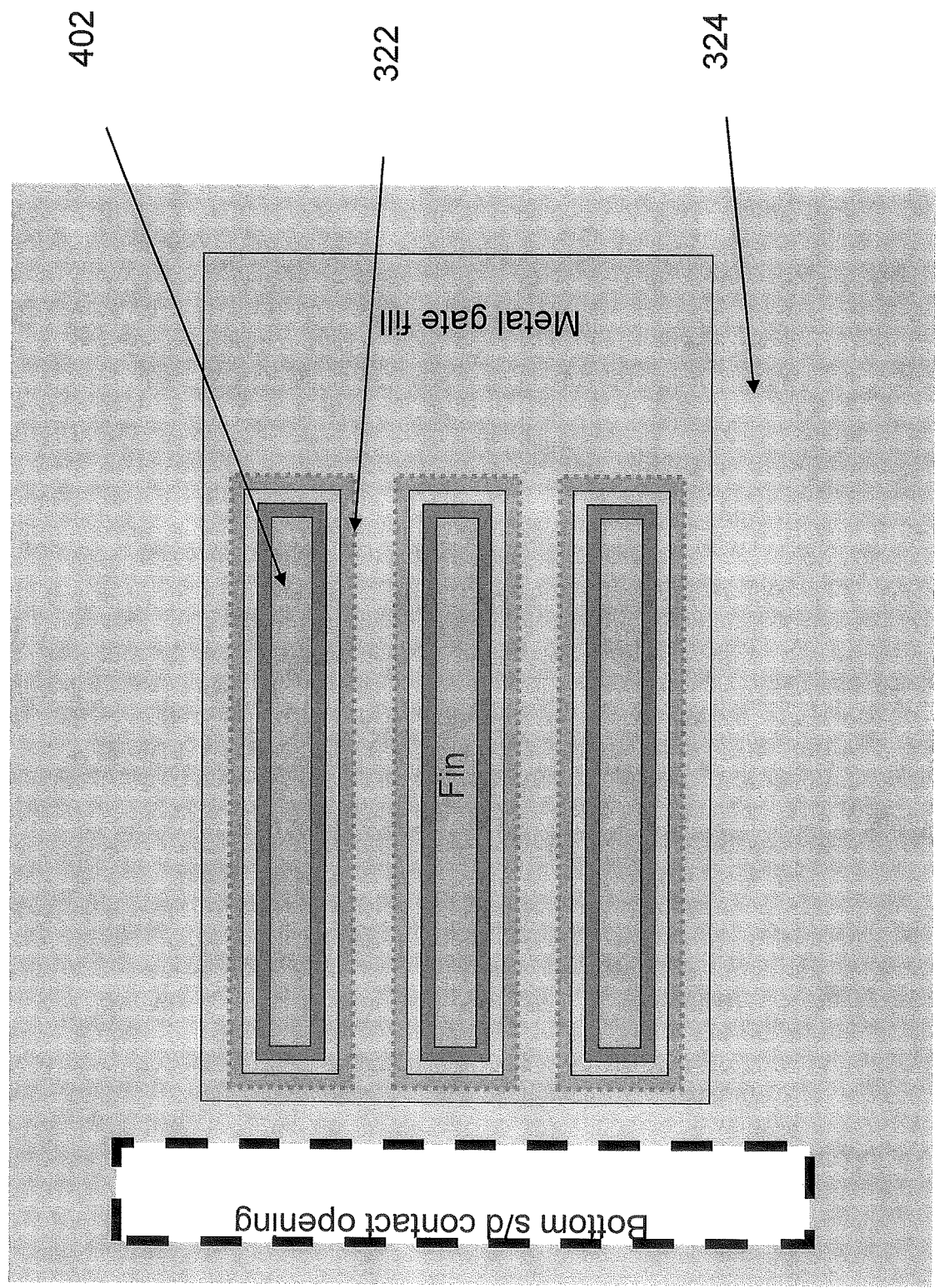
FIG. 5C illustrates another of full removal of the second epitaxial layer.

Selective partial removal of the second epi layer (Option 1) is shown in FIG. 5B. Selective full removal of the second epi layer (Option 2) is shown in FIG. 5C.

Figure 6B:
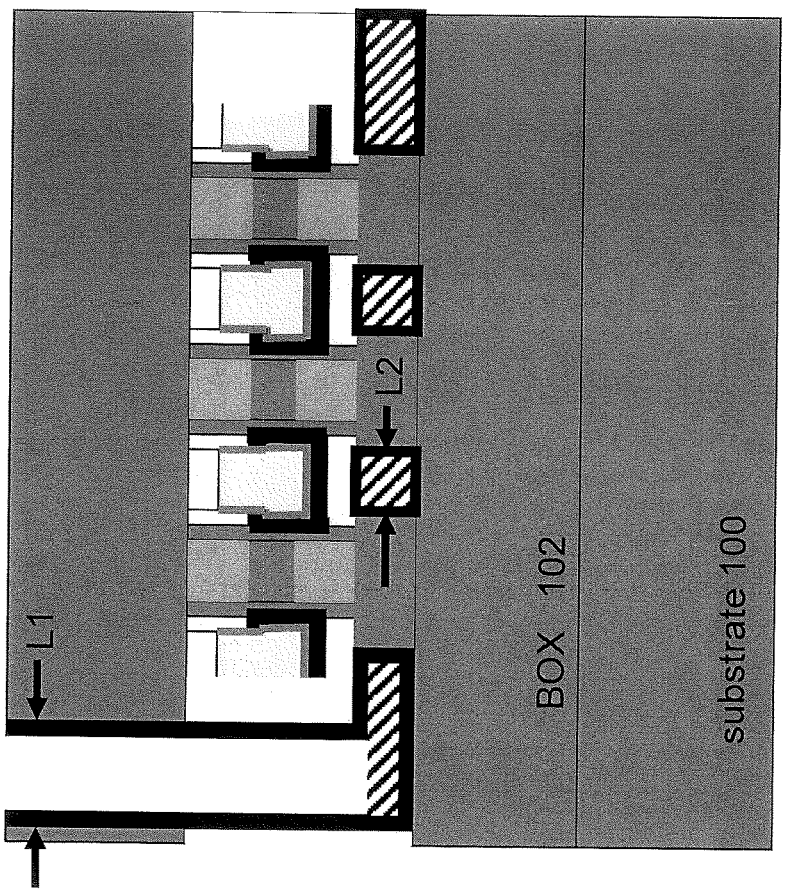
FIG. 6B illustrates ALD (atomic layer deposition) metal deposition of the structure shown in FIG. 6A.
Figure 6A:
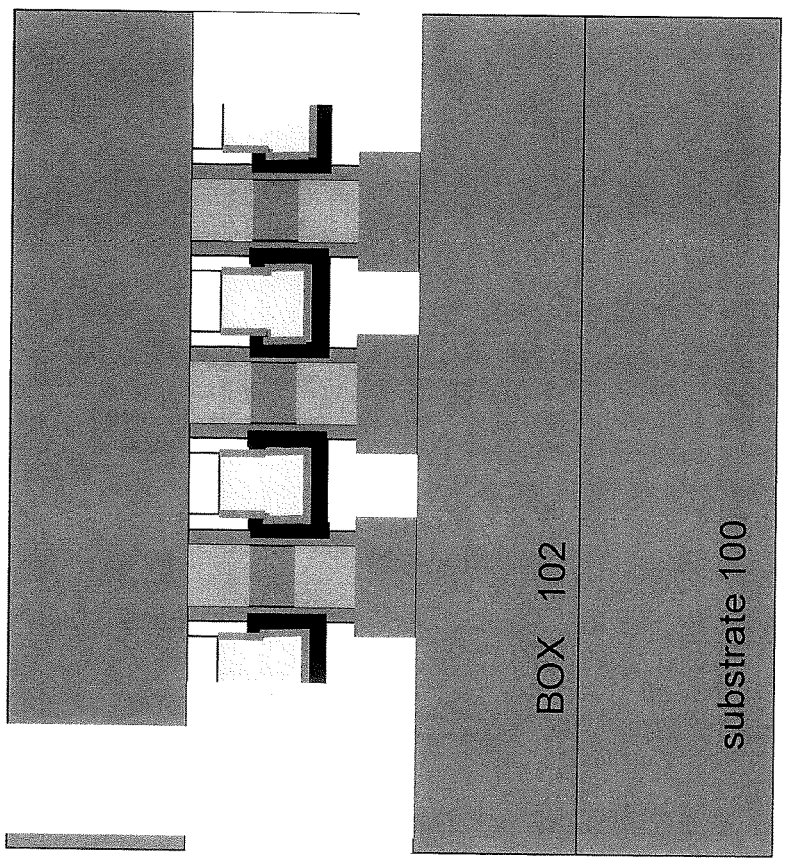
FIG. 6A shows the structure after selective removal of the second epi layer from FIG. 5B.
Figure 6D:
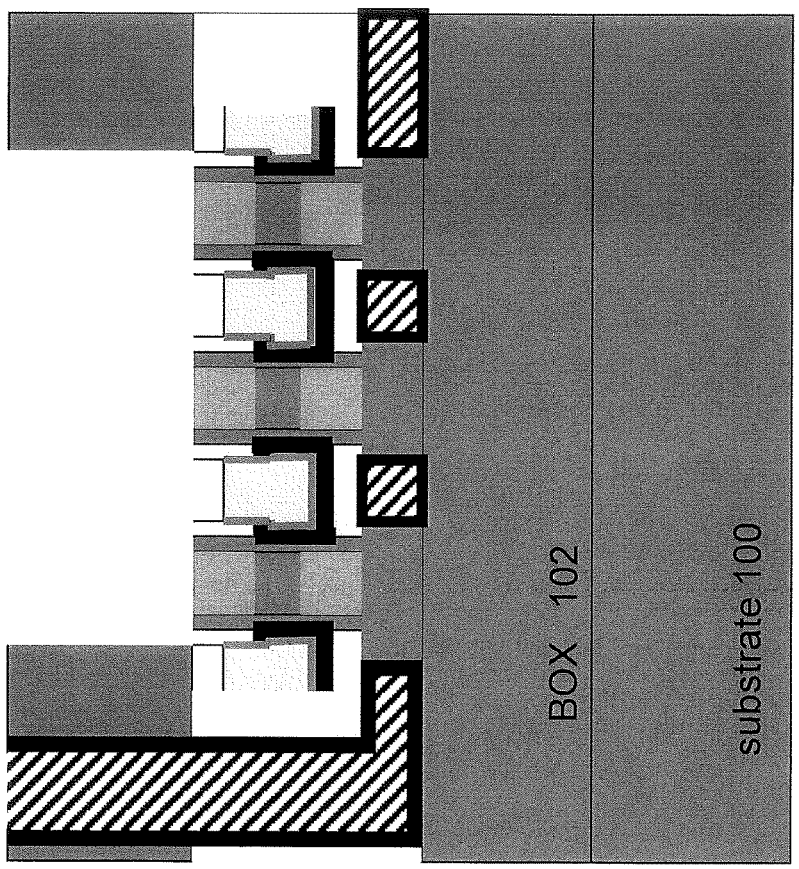
FIG. 6D shows the top source/drain opening via reactive ion etching (RIE).
Figure 6C:
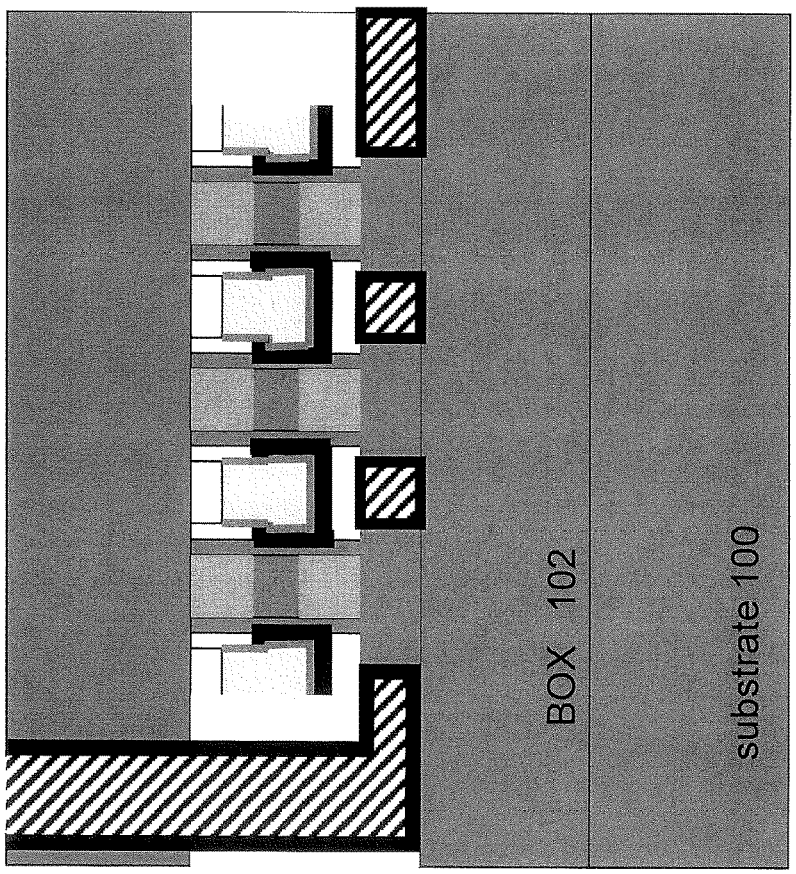
FIG. 6C shows a bottom contact fill and chemical mechanical processing (CMP).

FIG. 6A shows the structure after selective removal of the second epi layer from FIG. 5B. FIG. 6B illustrates ALD (atomic layer deposition) metal deposition following step in FIG. 6A. ALD metal deposition can partially or entirely fill the "subway" regions between the fins, under the gate. Here, they are shown as a complete fill for illustrative simplicity. This fill can also be multi-layered (e.g., Ni liner+W fill), as shown here. The exact structure drawn here is possible if L1>L2. FIG. 6C shows a bottom contact fill and chemical mechanical processing (CMP) after the step in FIG. 6B, while FIG. 6D shows the next step of top source/drain opening via reactive ion etching (RIE).

Figure 7:
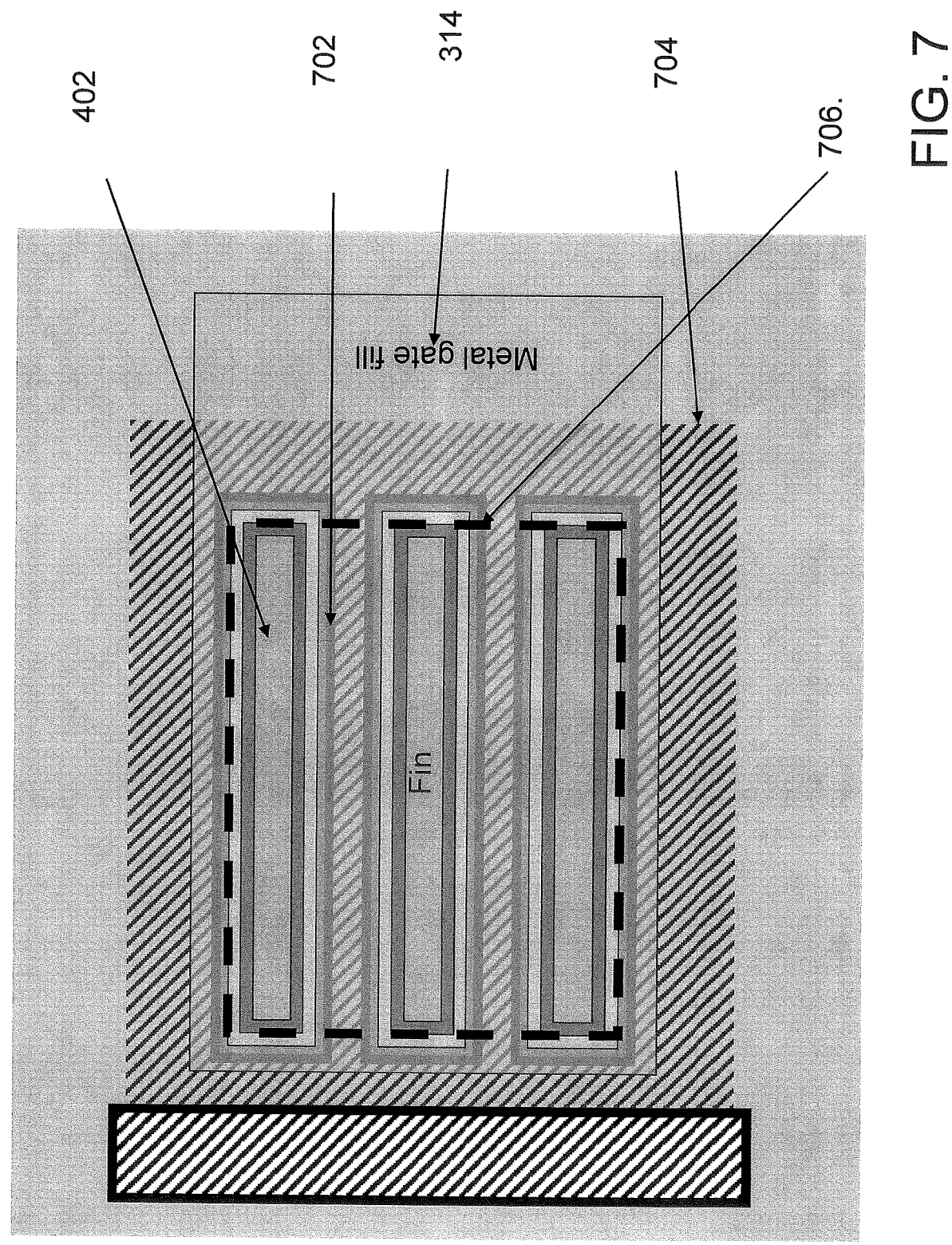
FIG. 7 provides a further illustration of method of forming the VFET structure in an example embodiment.

FIG. 7 provides a further illustration of method of forming the VFET structure in an example embodiment. FIG. 7 shows the structure after top source/drain opening RIE. The Bottom source/drain metal liner 702, metal gate contact 314, bottom source/drain metal fill 704, and the top source/drain opening perimeter, exposes all of top source/drain implanted region 706.

Figure 8D:
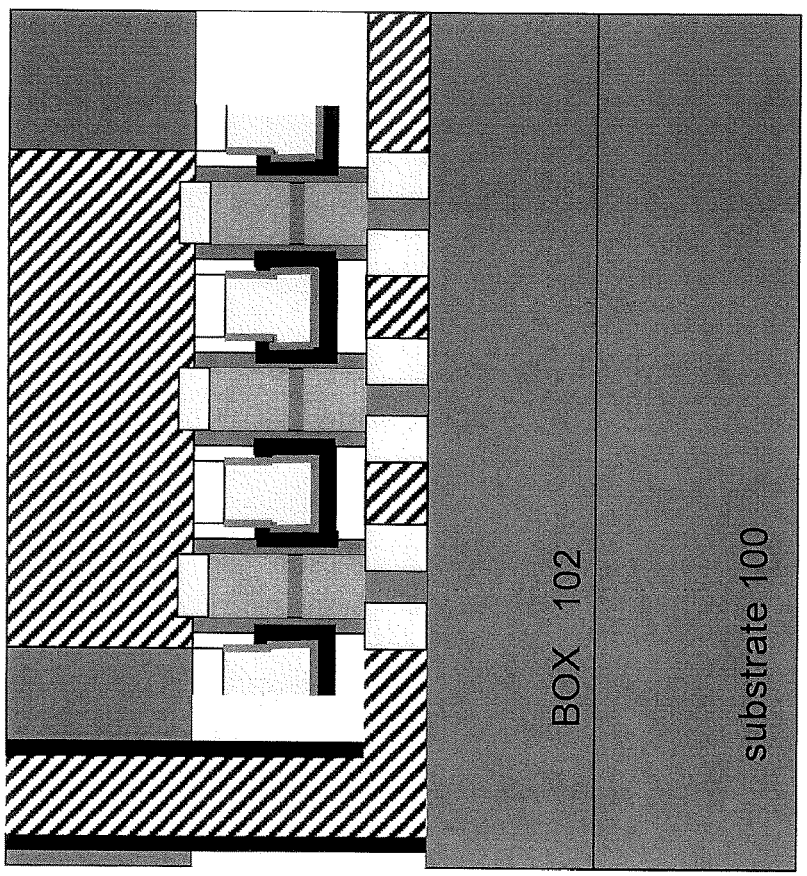
FIG. 8D shows source contact metal fill and CMP of the structure of FIG. 8C.
Figure 8C:
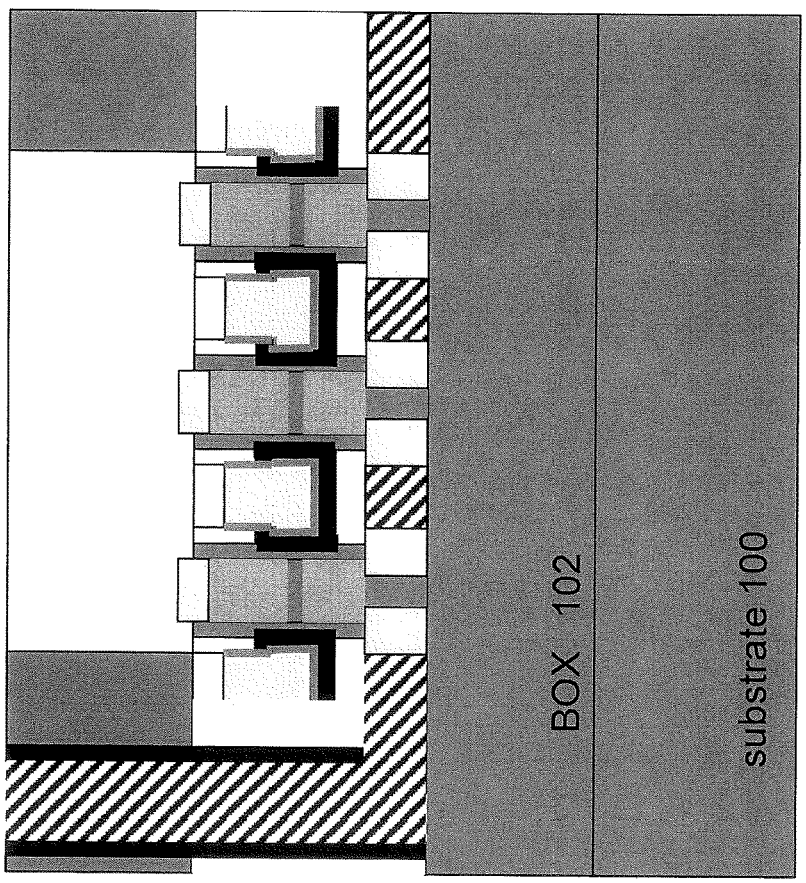
FIG. 8C shows source contact RIE.

FIG. 8A provides a further illustration of method of forming the VFET structure in an example embodiment. The metal deposition and silicidation is shown at 802. Bottom ALD liner metal reacts with bottom first epi layer to form silicide at 804. FIG. 8B shows the next step of ILD (interlayer dielectric) refill and CMP (chemical mechanical polishing). FIG. 8C shows source contact RIE #2 (second RIE) and FIG. 8D shows source contact metal fill and CMP of structure in FIG. 8C.

Figure 9:
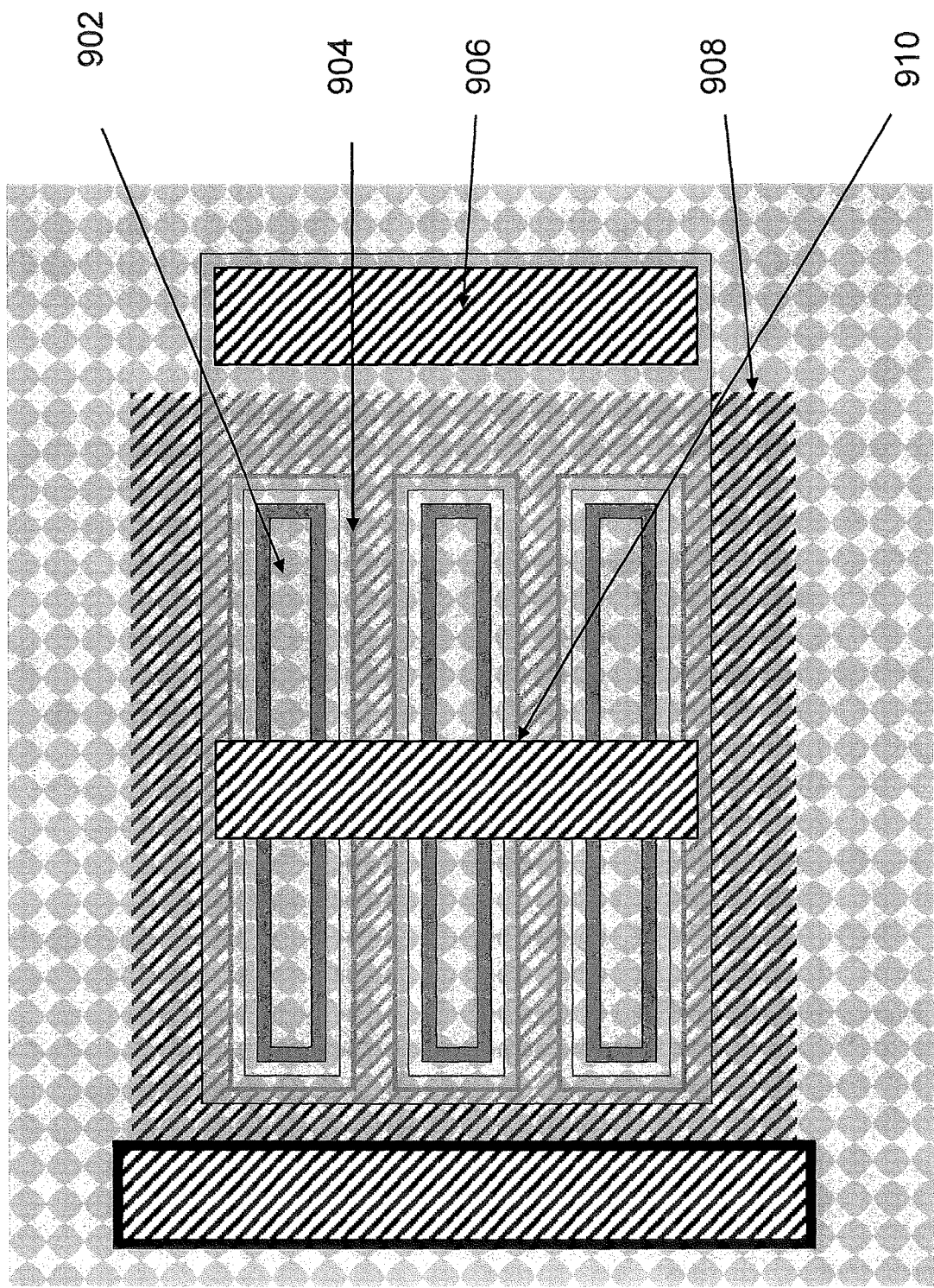
FIG. 9 illustrates another view of the VFET in an example embodiment.

FIG. 9 illustrates another view of the VFET in an example embodiment, FIG. 9 shows the structure after source, drain, and gate contact formation. The silicided top source/drain 902, bottom source/drain silicide 904, metal gate contact 906, bottom source/drain metal fill 908, and the top source/drain contact perimeter 910 is provided.

Thus, as shown a VFET structure is provided without requiring the finned channel region to be formed by growth inside a confined cavity. The "subtractive" process flow, to form a VFET structure, wherein the bottom source/drain, gate, and top source/drain are all formed around an etched tin as opposed to a grown fin. Formation of top and bottom metallic source/drain regions in this subtractive flow context, without requiring additional gate etching (which would compromise gate resistance) in order to access the bottom source/drain region is shown.

A subtractive process flow to achieve a VFET structure, wherein the bottom source/drain, top source/drain, and gate are all formed around a pre-defined fin has been described. The method of modulating the fin width post-fin patterning has also been described.

The many features and advantages of the invention are apparent from the detailed specification, and thus, it is intended by the appended claims to cover all such features and advantages of the invention, which fall within the true spirit and scope of the invention. Further, since numerous modifications and variations will readily occur to those skilled in the art, it is not desired to limit the invention to the exact construction and operation illustrated and described, and accordingly, all suitable modifications and equivalents may be resorted to, falling within the scope of the invention.

What is claimed is:

1. A semiconductor device, comprising:
   a substrate;
   a first device type formed on the substrate, the first device type comprising a first active channel region including a first fin, the first fin comprising a first fin width which is narrower than a second fin width of the first fin towards above and below the first active channel region, and
   a second device type formed on the substrate, the second device type comprising a second active channel region including a second fin of a different configuration than the first fin with respect to fin widths,
   wherein the first device type further comprises a gate dielectric stack covering a surface of the first active channel region, a top surface of the second fin width being above the first active channel region, and a bottom surface of the second fin width being below the first active channel region,
   further comprising a top portion and a bottom portion of sidewall spacers comprising a first dielectric covering the second fins above and below the second active channel region and a second dielectric covering the first dielectric.

2. The semiconductor device of claim 1, wherein said first dielectric is thicker than said interlayer dielectric.

3. A semiconductor device, comprising:
   a first fin being formed in a first active channel region of a first device type on a substrate,
   wherein a first fin width is narrower than a second fin width of the first fin towards above and below the first active channel region; and
   a second fin being formed of a different configuration than the first fin with respect to fin widths,
   wherein the first device type includes the first fin,
   wherein a second device type includes the second fin,
   wherein the first device type further comprises:
      a gate region that is merged between adjacent fins including the first fin; and
      a bottom source-drain region formed on the substrate and below the first fin, the bottom source-drain region comprising a metallic material; and
   further comprising a top portion and a bottom portion of sidewall spacers comprising a first dielectric covering the second fin above and below the second active channel region and a second dielectric covering the first dielectric,
   wherein the first dielectric is formed thicker than a interlayer dielectric,
   wherein a thinner portion of the first fin is self-aligned to the gate, and
   wherein one of the first fins under a top sidewall portion of the spacers has a width that is different than the width of another one of the first fins under a bottom sidewall portion of the spacers.

* * * * *